(12) United States Patent
Fisch et al.

(10) Patent No.: US 9,548,101 B2
(45) Date of Patent: Jan. 17, 2017

(54) RETENTION OPTIMIZED MEMORY DEVICE USING PREDICTIVE DATA INVERSION

(71) Applicant: Invensas Corporation, San Jose, CA (US)

(72) Inventors: David Edward Fisch, Pleasanton, CA (US); William C. Plants, Campbell, CA (US); Kent Stalnaker, Colorado Springs, CO (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/065,378

(22) Filed: Mar. 9, 2016

(65) Prior Publication Data

US 2016/0189765 A1 Jun. 30, 2016

Related U.S. Application Data

(60) Division of application No. 14/683,687, filed on Apr. 10, 2015, now Pat. No. 9,299,398, which is a continuation of application No. 13/868,884, filed on Apr. 23, 2013, now Pat. No. 9,007,866.

(51) Int. Cl.
| | |
|---|---|
| *G11C 11/24* | (2006.01) |
| *G11C 11/4091* | (2006.01) |
| *G11C 29/52* | (2006.01) |
| *G11C 7/02* | (2006.01) |
| *G11C 7/10* | (2006.01) |
| *G11C 11/4096* | (2006.01) |
| *G11C 7/00* | (2006.01) |
| *G11C 11/408* | (2006.01) |
| *G11C 7/06* | (2006.01) |

(52) U.S. Cl.
CPC ............ *G11C 11/4091* (2013.01); *G11C 7/00* (2013.01); *G11C 7/02* (2013.01); *G11C 7/1006* (2013.01); *G11C 7/1069* (2013.01); *G11C 7/1096* (2013.01); *G11C 11/4087* (2013.01); *G11C 11/4096* (2013.01); *G11C 29/52* (2013.01); *G11C 7/062* (2013.01); *G11C 7/065* (2013.01)

(58) Field of Classification Search
CPC ......... G11C 5/14; G11C 5/147; G11C 11/104; G11C 11/401; G11C 2207/2227
USPC .................................. 365/149, 227
See application file for complete search history.

(56) References Cited

U.S. PATENT DOCUMENTS

| | | | |
|---|---|---|---|
| 6,188,628 B1 * | 2/2001 | Tomotani | G11C 5/14 365/226 |
| 7,518,922 B2 | 4/2009 | Maejima et al. | |
| 8,369,166 B2 | 2/2013 | Kurjanowicz et al. | |
| 8,859,570 B2 | 10/2014 | McCabe | |

(Continued)

OTHER PUBLICATIONS

International Search Report for PCT Application No. PCT/US2014/034913, dated Aug. 21, 2014.

*Primary Examiner* — Huan Hoang

(57) ABSTRACT

A method for storing data. The method includes providing an addressable memory including a memory space, wherein the memory space includes a plurality of memory cells. The method includes configuring the addressable memory such that a majority of the plurality of memory cells in the memory space stores internal data values in a preferred bias condition when a first external data state of one or more external data states is written to the memory space, wherein the first external data state is opposite the preferred bias condition.

10 Claims, 16 Drawing Sheets

(56) References Cited

U.S. PATENT DOCUMENTS

2012/0069634 A1* 3/2012 Saito .................. G11C 11/404
   365/149

* cited by examiner

FIG. 6

RETENTION OPTIMIZED MEMORY DEVICE USING PREDICTIVE DATA INVERSION

CROSS-REFERENCE TO RELATED APPLICATIONS

This application is a divisional of U.S. patent application Ser. No. 14/683,687, filed Apr. 10, 2015, which is a continuation of U.S. patent application Ser. No. 13/868,884, filed Apr. 23, 2013, which issued as U.S. Pat. No. 9,007,866 on Apr. 14, 2015, the disclosure of which is incorporated herein by reference.

BACKGROUND

Semiconductor memory devices, such as dynamic random access memories (DRAMs) are included in an array of programmable memory cells for purposes of storing and accessing data. The DRAM cell includes a field effect transistor (FET) and a storage capacitor. Information is stored on the capacitor either in a charged state or discharged state. The FET provides access to the capacitor during read and write operations. Additionally, the DRAM cell periodically is refreshed to retain the proper state, because of a potential leakage in the capacitor.

The configuration of a DRAM memory array is typically robust, and is capable of being accessed for read, write, and refresh operations with very low error rates. However, a memory cell is susceptible to various types of errors that may not be shown as a defect in the cell, but are due to factors that influence the memory cell at one particular time. As such, the state of a memory cell may be affected by noise, soft error rates, leakage, and other factors that may result in data loss.

For instance, non-defect related errors, including soft errors, are due to electrical, magnetic, or other interferences affecting the memory cell. These errors may be due to internal or external generation of noise and/or radiation. For instance, these errors may be due to background radiation generated from a material decay in a chip resulting in stray alpha particles randomly hitting a memory cell, or cosmic radiation (e.g., noise) due to very high energy particles originating from outer space that are hitting memory cells in an array. Also, with higher densities of cells in a memory array, the possibility of noise related disturbs of individual memory cells increases. More particularly, these random electrical occurrences may affect the stored charge on the capacitor of the DRAM memory cell, and cause the memory cell to change state. As such, these errors may not necessarily be due to a defect in the cell construction, however, the information stored on the DRAM memory cell may be incorrect.

On the one hand, because the data loss due to non-defect related errors is not fatal to the memory, the memory cell may be corrected to properly store the valid state of the memory cell after the error is discovered. However, the ability to correct comes with the added penalty of increased circuit complexity, increased chip size, increased power usage, and/or reduced access time. On the other hand, the data loss may result in improper execution of an application or a system crash, since it may change an instruction or data value. In that case, although the memory system is fully functional, the underlying application and/or data has been damaged and may require correction of the states of the affected memory cells. For instance, the affected memory cells may be rewritten (e.g., through error detection and correction techniques), or the system may be rebooted in order to resuscitate a crashed application by repopulating the information in the memory array.

Also, latent defects may adversely affect a memory cell by increasing the rate of signal loss and increasing the probability of soft errors. For instance, one or more latent defects may weaken a memory cell over time, bringing that cell closer to a point of failure. A cell with a latent defect may operate on the margins of failure and not fail under normal operating conditions. However, that cell, when compared to stronger cells without latent defects, may be more prone to soft errors when exposed to the previously discussed interferences (e.g., electrical, magnetic, etc.).

It is desirous to provide a memory array that is less susceptible to non-defect errors, such as, noise, soft errors, etc.

SUMMARY

Embodiments of the present invention provide for a method and architecture to optimize data retention and soft error rate in a memory array by storing data biased towards a preferred memory state of the individual memory cells, wherein the storing is based on the expectation that without implementation of embodiments of the present invention, a majority of memory cells would be presented with data for storage in a state that is opposite the preferred memory state.

In one embodiment, a method for storing data is presented. The method includes providing an addressable memory comprising a memory space. The method further includes configuring the addressable memory such that a majority of the plurality of memory cells in the memory space stores internal data values in a preferred bias condition when a first external data state of one or more external data states is written to the memory space. For instance, the preferred bias condition may be an electrical "0", which is the default state of the memory cells. The first external data state is opposite the preferred bias condition.

In another embodiment, a memory system is disclosed for purposes of storing data. The memory system includes an addressable memory including a memory space, wherein the memory space includes a plurality of memory cells. The addressable memory is configured such that a majority of a plurality of memory cells in the memory space stores internal data values in a preferred bias condition when a first external data state of one or more external data states is written to the memory space. For instance, the preferred bias condition may be an electrical "0", which is the default state of the memory cells. The first external data state is opposite the preferred bias condition.

In still another embodiment, a method for storing, and more particularly, a method for storing data is presented. The method includes providing an addressable memory, wherein the addressable memory includes a plurality of memory cells. The method includes providing at least one memory write path for writing to the plurality of memory cells in the memory space. The method includes providing at least one memory read path for reading from the plurality of memory cells in the memory space. The method further includes selectively inverting data on both the at least one memory read path and the at least one memory write path such that an internally stored data value in a memory cell is largely independent of a corresponding memory cell location in the memory space.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

PRIOR ART

PRIOR ART

FIG. 6 is a table illustrating the treatment of signals before and after storage into a memory system wherein data is stored in a preferred bias condition, in accordance with one embodiment of the invention.

DETAILED DESCRIPTION

Figure 1A:
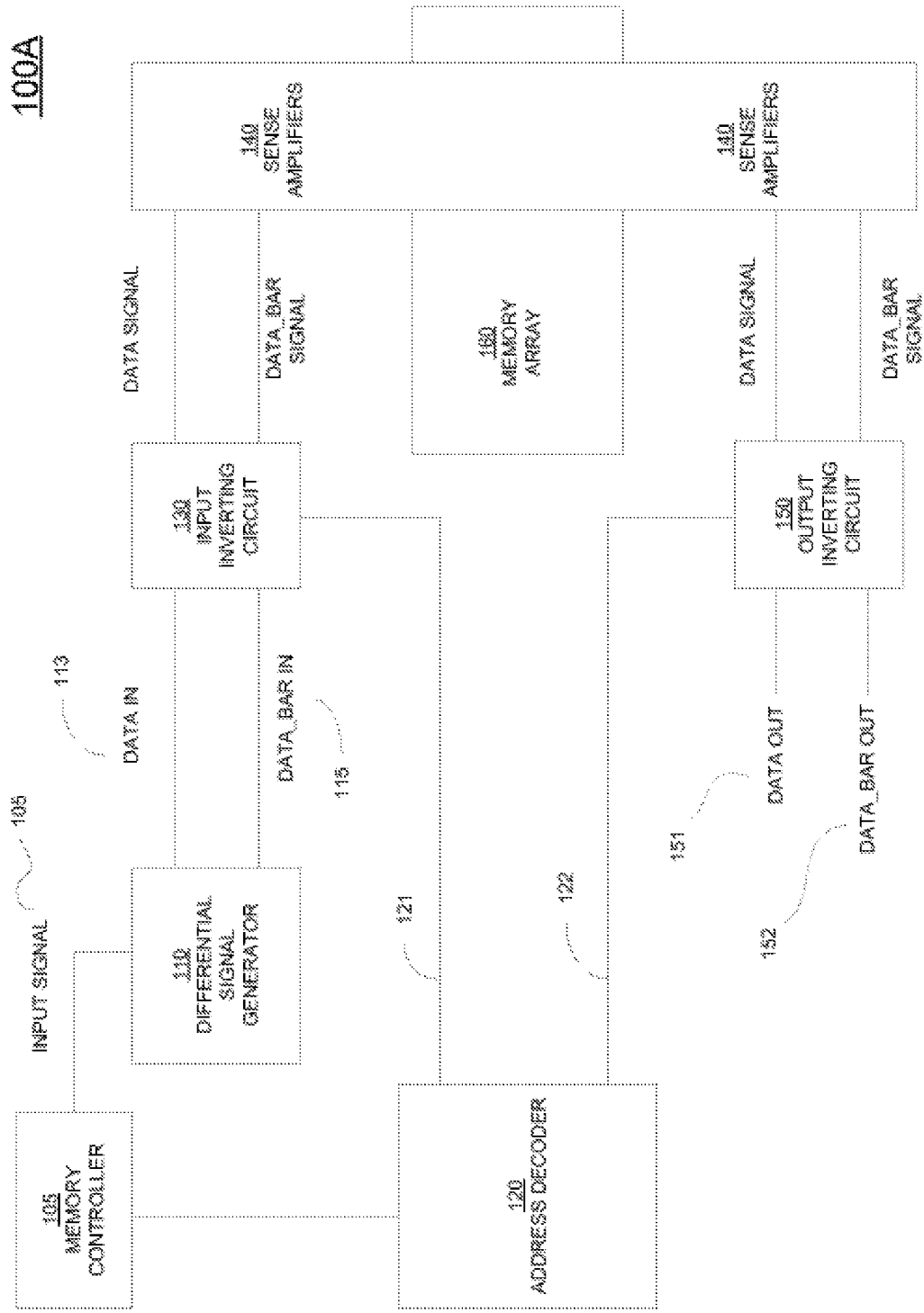
FIG. 1A is a block diagram of a memory system that is configured to store data in a preferred bias condition, in accordance with one embodiment of the invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure provide for bit cell topographies (i.e., mapping from electrical to physical data state) that are configured to store input data having a first data state into a memory array a majority of the time in a preferred bias condition, which makes the memory system as a whole more immune to data loss due to noise, soft error rates, leakage, and other factors that could impact data integrity. Other embodiments of the present disclosure provide the above accomplishments and further provide for bit cell topographies that are configured to optimize data retention and soft error rate immunity based on an expectation that more cells are presented data for storing to a memory cell (e.g., DRAM) as electrical "1s" over "0s", but are stored into the memory array in such a manner that a majority of "0s" are stored into the array. Still other embodiments of the present disclosure provide the above accomplishments and further provide for bit cell topographies that are configured to optimize data retention and soft error rate immunity based on an expectation that a majority of data presented to a memory system is in an electrical "0" state, and a majority of cells receive and store an electrical "1" signal.

Embodiments of the present invention provide for storing an externally received data state (e.g., one or more electrical "1s" received through an input signal) into an addressable memory in a preferred bias condition (e.g., "0"). More particularly, in relation to data provided to a memory address wherein the external data state is opposite a preferred bias condition, for a majority of the memory addresses, the internal data values stored in the memory address will be in the preferred bias condition. Ideally, for all addressable memory locations, write operations where the data is opposite a preferred memory state the internal data values will be stored in the preferred bias condition (e.g., when all "1s" are written to a memory device, they will be stored internally as all "0s"). Additionally, a majority of the cells in the memory array are configured such that when an externally received data state (e.g., "1") is presented to the addressable memory, they will be stored in a preferred bias condition (e.g., "0"). In isolated instances (e.g., in cases of errors or the use of dedicated spare cells or a spare row or column of cells), internally stored values for a given data state may not be stored in the preferred bias condition; but throughout the addressable memory, a majority of cells in the addressable memory will still store internal data values in the preferred bias condition. Other embodiments provide for storing an externally received data state (e.g., a plurality of electrical "1s" received through an input signal) into an addressable memory in a preferred bias condition that is independent of location of the corresponding memory cell. That is, in relation to the external data state (e.g., one or more "1s"), the one or more internal data values (e.g., preferred bias condition) stored into memory in each instance is independent of the memory location of corresponding memory cells. For instance, when receiving an input signal containing all "1s", internal data values are stored in the preferred bias condition (e.g., "0") throughout the memory array. As such, embodiments of the present invention provide for storage into an addressable memory a received data state (e.g., one or more "1s") in a preferred bias condition over a majority of cells in the memory array, and/or in such a manner that is largely independent of memory cell location.

The double data rate synchronous dynamic random-access memory (DDR SDRAM) provides for higher transfer rates than a single data rate SDRAM memory system at a particular clock frequency. That is, the DDR SDRAM interface allows for the transfer of data both on the rising and falling edges of the underlying clock signal. The fourth generation of the DDR SDRAM standard (DDR4 SDRAM), as implemented by the JEDEC Solid State Technology Association, is configured to have a high voltage "1" termination on its data input/output pins. As a result, reading and writing "1s" to the memory array will consume less power, since a corresponding input is already in a "1" state. However, reading and writing external "0s" to the memory will require that the terminated line be pulled down to a "0" state, thereby consuming power. Because reading and writing "1s" will consume less power on the DQ bus and/or pins, power optimized systems in embodiments of the present invention will preferentially write more "1s" than "0s" to the memory system, but store more "0s" than "1s" to the memory array, or rather the memory system is configured to store data into the memory array in a manner that is statistically biased towards the preferred bias condition (e.g., "0" for a typical n-channel array). Other embodiments preferentially write more "1s" than "0s" to the memory system but store more "1s" than "0s". Still other embodiments preferentially write more "0s" than "1s" to the memory system but store more "1s". Also, other embodiments preferentially write more "0s" than "1s" to the memory system but store more "0s".

Figure 1B:
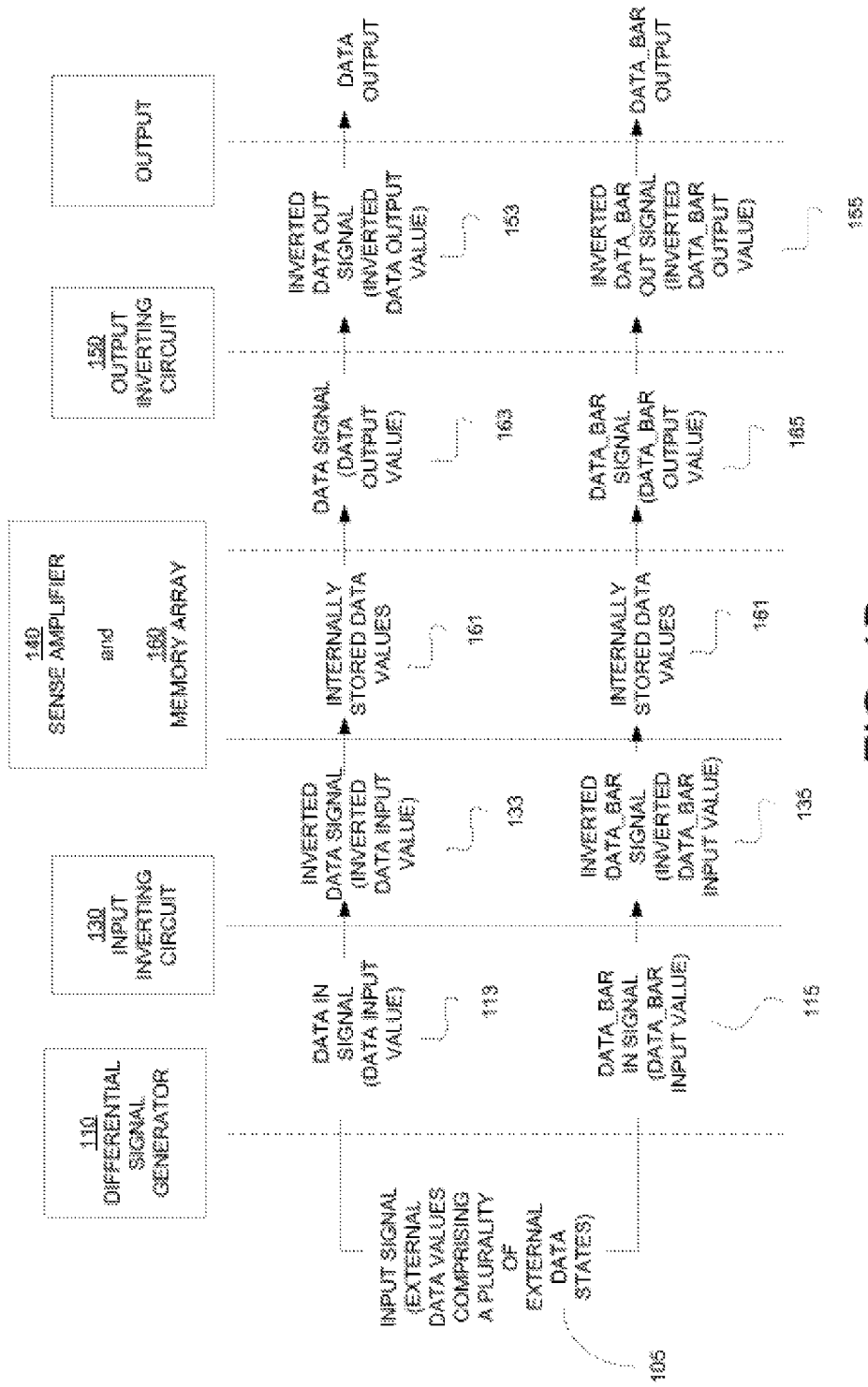
FIG. 1B is a diagram illustrating terminology of data conditions when storing data to a memory cell coupled to a positive node of a sense amplifier in the memory system of FIG. 1A that is configured to store selected data in a preferred bias condition, in accordance with one embodiment of the present disclosure.
Figure 1C:
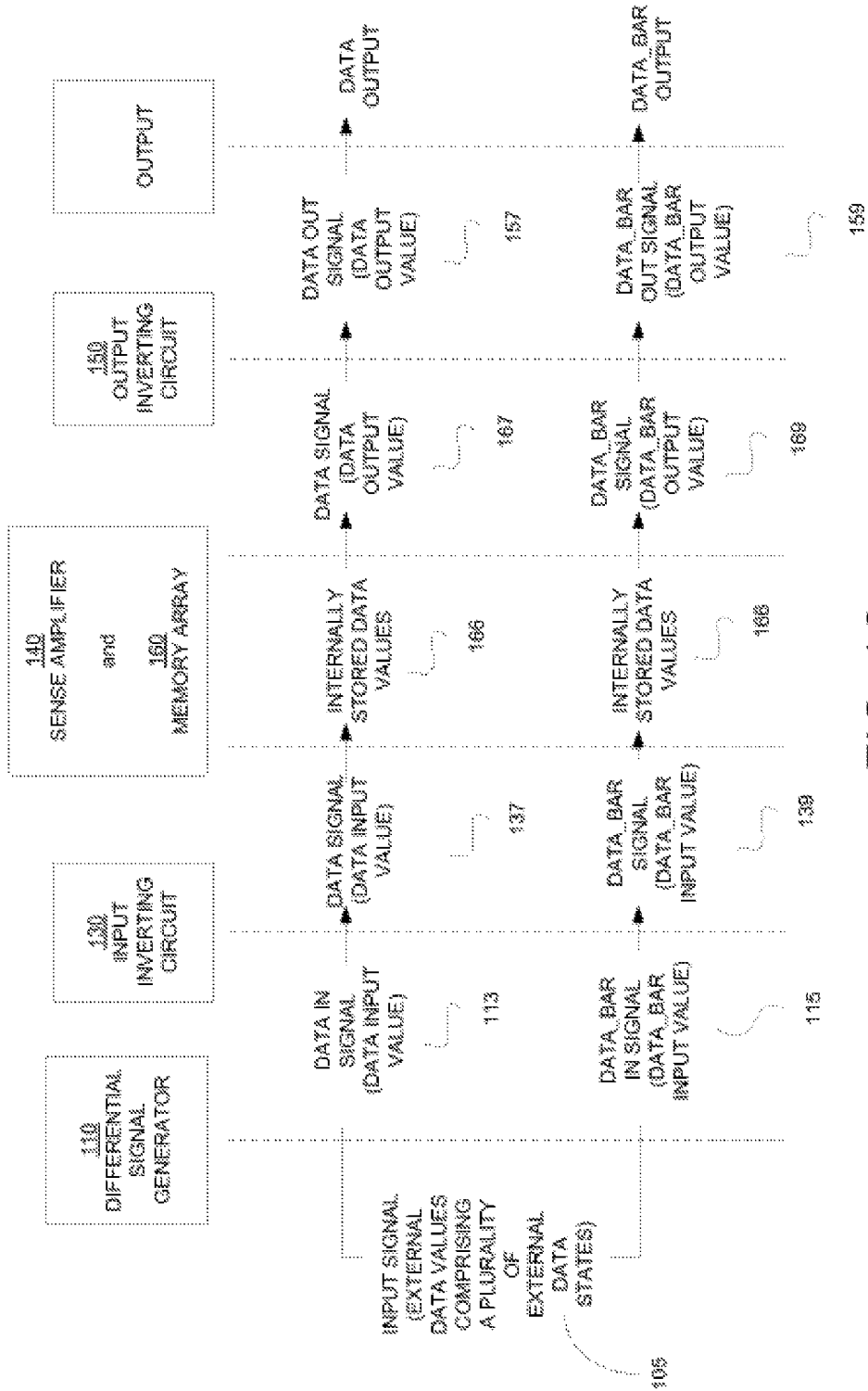
FIG. 1C is a diagram illustrating terminology of data conditions when storing data to a memory cell coupled to a negative node of a sense amplifier in the memory system of FIG. 1A that is configured to store selected data in a preferred bias condition, in accordance with one embodiment of the present disclosure.

FIGS. 1A-C are diagrams illustrating a memory system that is configured to store data of a particular state largely in a preferred bias condition that is independent of the address and/or location of the storing memory cell in a memory array. More specifically, FIG. 1A is a block diagram of a memory system 100A that is configured to store data in a preferred bias condition, in accordance with one embodiment of the invention. FIG. 1B is a data flow diagram 100B illustrating the flow of signals and the terminology used to describe the flow of signals when storing data values to a memory cell coupled to a positive node of a sense amplifier in a memory system that is configured to store data of a particular state largely in a preferred bias condition that is independent of the address and/or location of the storing memory cell in a memory array, in accordance with one embodiment of the present disclosure. FIG. 1C is a data flow diagram 100C illustrating the flow of signals and the terminology used to describe the flow of signals when storing data values to a memory cell coupled to a negative side of a sense amplifier in a memory system that is configured to store data of a particular state largely in a preferred bias condition that is independent of the address and/or location of the storing memory cell in a memory array, in accordance with one embodiment of the present disclosure. In one embodiment, the memory systems 100A-C of FIGS. 1A-C are configured to receive external data values of an input signal comprising a first data state, and storing the received external data values in a preferred bias condition in a majority of cases. In another embodiment, memory systems 100A-C are configured to take advantage of an expected pattern of signals for storage in order to optimize power consumption, improve data retention, and/or reduce soft error rates.

Turning now to FIG. 1A, as shown, the memory system 100A includes a memory controller 106 for managing the flow of data flowing to and from the memory array 160. In particular, memory controller provides an input signal 105 that comprises a plurality of external data values for purposes of writing to the memory array 160. The external data values comprise a plurality of external data states, such as, "1s" and "0s". More particularly, the memory controller 106 delivers control signals throughout the memory system 100A enabling reads and writes to memory cells in the memory array 160.

The memory system 100A includes a differential signal generator 110 for receiving the input signal 105 and outputting a pair of data input signals for purposes of storing. In particular, the pair of data input signals includes a data in signal 113 that is representative of the original input signal 105, and comprises one or more data input values. In addition, the generator 110 generates a data_bar in signal 115 comprising one or more data_bar input values, wherein the data_bar in signal 115 represents a complement to the data in signal 113.

Also shown in FIG. 1B, the input signal 105 comprises a plurality of external data values. The data values may be of one or more data states, such as, a first state, a second state, etc. For instance, in one embodiment, data values may be in one of two states, such as, a "0" or a "1". In other embodiments, two or more data states are supported. Also, the data in signal 113 comprises a plurality of data input values, and the data_bar in signal 115 comprises a plurality of data_bar input values.

Memory system 100A of FIG. 1A includes an address decoder 120 that is coupled to the memory controller 106. Address decoder 120 located on an address path and is configured to determine the address of a memory cell to which an external data value of the input signal 105 (through the data in signal 113 and the data_bar in signal 115) is written, or to determine the address of a memory cell that is read. That address decoder sends a control signal 121 or 122 to input inverting circuit 130 or output inverting circuit 150 depending on the address of the corresponding memory cell. For instance, the address decoder 120 is configured to determine whether the memory cell is coupled to a positive node of a corresponding sense amplifier, which may be a function of which side of the array the memory cell is located (e.g., open bit-line architecture) or whether the memory cell is coupled to an even word line (e.g., folded bit-line architecture). The address of the memory cell will dictate how the data in signal 113 and/or data_bar in signal 115 are treated before storing into the memory array 160.

More particularly, memory system 100A also includes an input inverting circuit 130 that is coupled to the differential signal generator 110, and is configured to store particular data values of the input signal 105 in a preferred bias condition, depending on how the input signal 105 is handled internally by the memory system 100A. For example, the inverting circuit 130 will either invert, or pass without inverting, selected values of the data in signal 113 and/or data_bar in signal 115 in order to orient its state such that it is delivered to the memory array 160 in a preferred bias condition, as will be further described below. In one embodiment, the data in signal 113 and/or data_bar in signal 115 are based on an input signal that is statistically biased to having data values of a first data state (e.g., "1") over a second data state (e.g., "0").

For instance, FIG. 1B shows that an external data value of the data in signal 113 of a first data state is inverted by the input inverting circuit 130 under certain conditions to generate an inverted data signal 133. In particular, the external data value of a first data state (e.g., "1") is inverted by the input inverting circuit when storing to a memory cell coupled to a positive bit line input/output node of a corresponding sense amplifier. As such, the data in signal 113 comprises the external data value of a first state, and the inverted data signal 133 comprises the inverted data input value. Also, for the same external data value, the data_bar in signal 115 is inverted by the input inverting circuit 130 to generate an inverted data_bar signal 135 comprising the inverted data_bar input value.

FIG. 1C shows that an external data value of the data in signal 113 of a first data state is passed (i.e., not inverted) by the input inverting circuit 130 under certain conditions to generate a data signal 137. In particular, the external data value of a first data state (e.g., "1") is passed by the input inverting circuit and stored as an internally stored value 166 when storing to a memory cell coupled to a negative bit line input/output node of a corresponding sense amplifier. As such, the data in signal 113 comprises the external data value of a first state, and the data signal 137 comprises the passed data input value. Also, for the same external data value, the data_bar in signal 115 is passed by the input inverting circuit 130 to generate a passed data_bar signal 139 comprising the passed data_bar input value and stored as an internally stored value 166 when storing to a memory cell coupled to a negative bit line.

Memory system 100A also includes a plurality of sense amplifiers 140 that are coupled to bit lines in the memory array 160 for facilitating WRITE and READ operations. In other embodiments, instead of sense amplifiers, any means suitable for measuring current or voltage is coupled to the plurality of bit lines. The sense amplifier and/or measuring means are used for purposes of measuring current or voltage when performing WRITE and READ operations on the memory array 160.

As shown, the memory system includes a memory array 160 that includes a plurality of memory cells having a preferred bias condition, previously described. For instance, array 160 includes a plurality of memory cells laid out in rows and columns and arranged in various configurations. In one implementation, the array 160 includes a plurality of SDRAM memory cells and comprises an open bit-line architecture, and in another implementation a folded bit-line architecture. The memory cells are configured to retain a state for purposes of storing data. For example, in a DRAM implementation, data is stored on the capacitor either in a charged state ("1") or discharged state ("0").

In one embodiment, the memory cells in array 160 comprise single-ended memory cells, wherein a single bit line is used to capture the voltage level of a memory cell. In that manner, the voltage on the corresponding bit line is compared against a reference voltage to determine the state stored in the memory cell. For instance, if the voltage is higher than the reference voltage, then the state of the memory cell indicates an electrical "1", whereas if the voltage is lower than the reference voltage, then the state of the memory cell indicates an electrical "0".

Further, the memory cells have a preferred bias condition. Embodiments of the present invention do not impact the ability for any given memory cell to retain an electrical "1" or "0", and instead provide for data storage in the preferred bias condition a majority of the time in a memory array, wherein the preferred bias condition is implemented to optimize low power consumption (e.g., during reads and/or writes), reduce the effect of non-defect errors (e.g., noise, soft error rates, etc.), as well other optimizing factors. In one embodiment, the preferred bias condition is a default state (e.g., "0" for an n-channel DRAM array, and "1" for a p-channel memory array), wherein the memory cell has a tendency under certain scenarios to revert back to its default state. In another embodiment, the preferred bias condition is the state that provides for the least amount of power when executing read and/or write operations. For instance, flash memory cells in a memory array may exhibit lower power usage when reading "0s" over "1s".

Figure 3A:
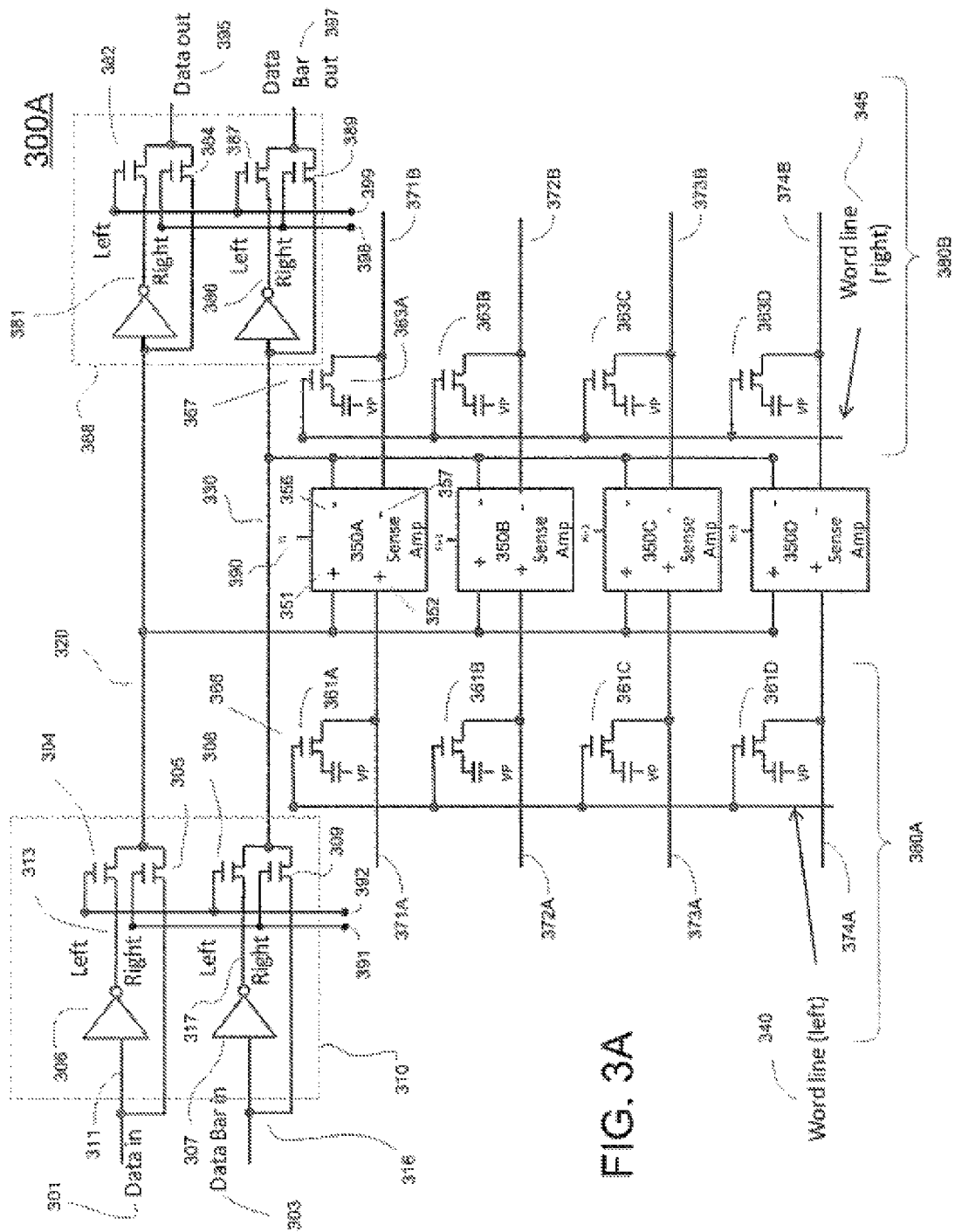
FIG. 3A is a layout of an open bit line memory array, wherein the memory array is configured to store selected data in memory cells in a preferred bias condition, in accordance with one embodiment of the invention.
Figure 7:
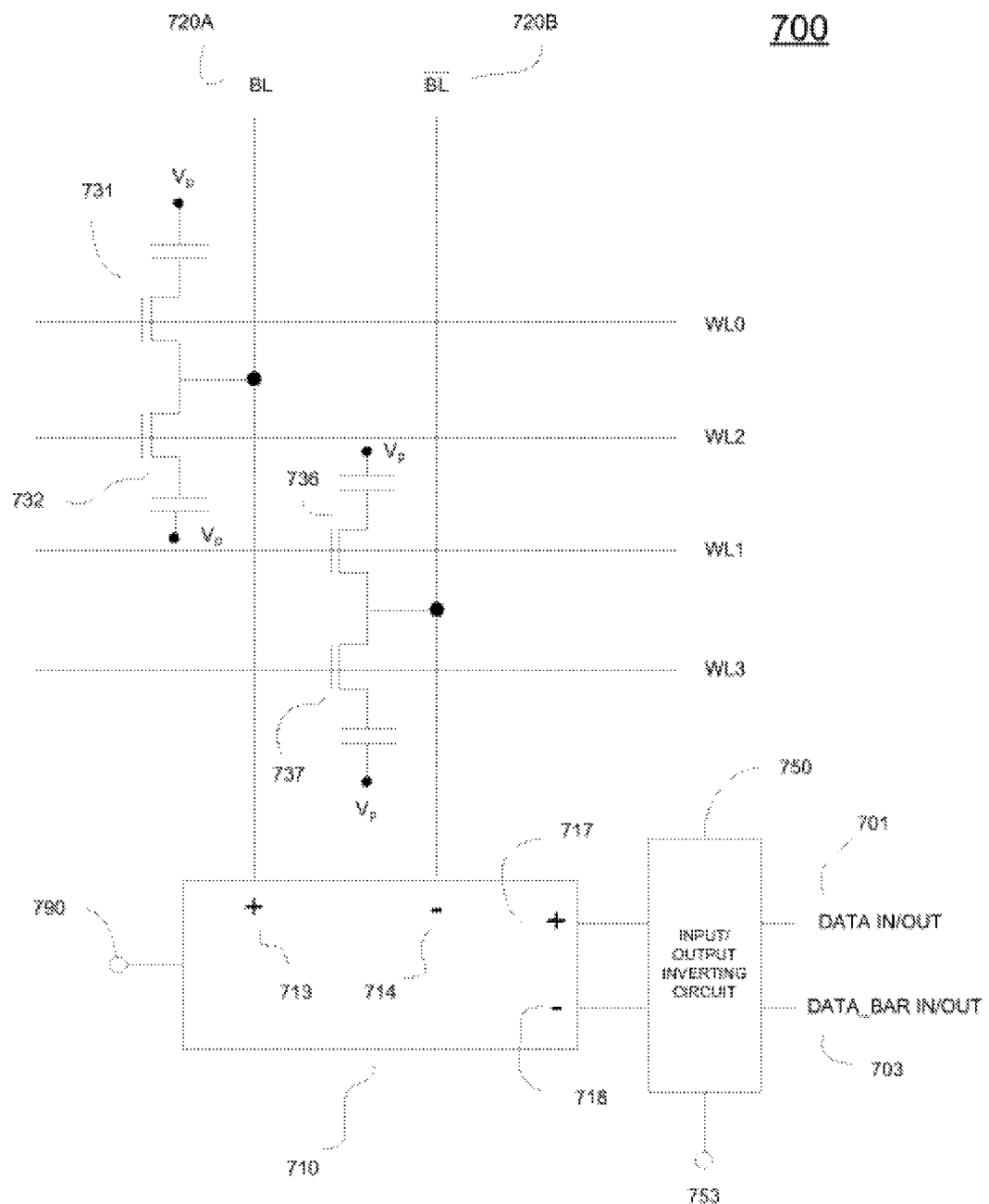
FIG. 7 is a layout of a folded bit line memory array, wherein data is configured to store data in memory cells in a preferred bias condition, in accordance with one embodiment of the invention.

The memory array 160 includes one or more configurations of memory cells. In one implementation, memory array 160 is configured in an open bit-line architecture including one or more memory cells (e.g., DRAM) as is shown in FIG. 3A, and in another implementation is configured in a folded bit-line architecture as is shown in FIG. 7.

In one embodiment, the memory array system 100A receives an input signal 105 having data values of a first state. For various motivations previously described and other motivations, those data values of a first state are handled within the memory array system 100A such that the corresponding internally stored data values 161 are stored largely independent of where they are stored in memory. More specifically, data values of a first state of an input signal are internally stored largely in a preferred bias condition no matter where the corresponding target memory cells are located.

In one embodiment, the memory system 100A receives an input signal 105 with the expectation that a majority of data values of the input signal 105 is of a first state. For instance, the input signal may include data values having a majority of "1s". This is accomplished through manipulation of the data before delivery to the memory system 100A. In one embodiment, the manipulation of the data occurs in hardware. In another embodiment, the manipulation of the data occurs in software, or at the application level.

For instance, in the case of DDR4 SDRAM memory, since the JEDEC standard will have input/output ports (I/O's) terminated to a HIGH level, and not a midpoint, it is expected that the memory system 100A will deliver more electrical "1s" in an effort to save power. This may be achieved at various locations in the treatment of data. For example, statistically biasing the data to electrical "1s" may occur at the system level (e.g., at a memory controller of the memory system 100A), or at an application level. As such, without further manipulation, the input signal 105 would have values that are heavily weighted to electrical "1s" for purposes of storing, as intended.

Embodiments of the present invention improve data retention and reduce soft error rates by storing data, originally received as external data values of an input signal 105 having a first external data state (e.g., "1"), as internally stored data values 161 having a preferred bias condition (e.g., "0" or "1") in any given memory cell in a memory array or space. In particular, the memory system 100A includes an input inverting circuit 130 that selectively converts data values of the data in signal 113 or data_bar in signal 115 so that the internally stored data values 161 are stored in the preferred bias condition. This is achieved by either selectively inverting or passing one or more data values of the data in signal 113 or data_bar in signal 115.

In one embodiment, the preferred bias condition is opposite the first external data state. For example, in the case of DDR4 SDRAM an input signal may comprise a majority of external "1s", as previously described. For any given cell, after the implementation of the input inverting circuit 130, that cell will have a higher likelihood of storing an electrical "0" rather than an electrical "1". Thus, over time, that memory cell, and the memory array 160, will be statistically less likely to fail since it is storing data biased towards the preferred state a majority of the time. In another embodiment, the preferred bias condition is the same as the first external data state.

The memory system 100A also includes an output inverting circuit 150 that is coupled to the sense amplifier 140. In one embodiment, the output inverting circuit 150 is able to determine what actions have been performed on the data stored in a particular memory cell of the memory array 160 by the input inverting circuit 130 (e.g., based on the location of the memory cell), and to perform appropriate actions to the data being read from that memory cell before delivery as an output signal, either as data out signal 151 and/or data_bar out signal 152. For instance, the address decoder 120 is configured to determine whether the memory cell being read is coupled to a positive bit line input/output node of a corresponding sense amplifier, which may be a function of which side of the array the memory cell is located (e.g., open bit-line architecture) or whether the memory cell is coupled to an even word line (e.g., folded bit-line architecture). The address of the memory cell being read will dictate how the data signal and/or data_bar signal from a corresponding sense amplifier are treated (e.g., inverting or passing) before being delivered as an output signal.

For instance, FIG. 1B shows that the output inverting circuit 150 inverts the data output value of the data signal 163 obtained from a corresponding sense amplifier under certain conditions to generate an inverted data output value of the now inverted data out signal 153. That is, the address decoder 120 sends a control signal to the output inverting circuit 150 to invert or pass data depending on where the corresponding memory cell being read is located. In particular, the data output value is inverted by the output inverting circuit when reading from a memory cell coupled to a positive node of the corresponding sense amplifier. As such, the data signal 163 comprises the data output value, and the inverted data out signal 153 comprises the inverted data output value. Also, the corresponding data_bar output value from the data_bar signal 165 is inverted by the output inverting circuit 150 to generate an inverted data_bar out signal 155. As such, the data_bar signal 165 comprises the data_bar output value, and the inverted data_bar output signal 155 comprises the inverted data_bar output value.

FIG. 1C shows that the data output value of the data signal 167 obtained from a corresponding sense amplifier is passed (e.g., without inverting) under certain conditions to generate a data output value of the data out signal 157. That is, the address decoder 120 sends a control signal to the output inverting circuit 150 to invert or pass data depending on where the corresponding memory cell being read is located. In particular, the data output value of data signal 167 is passed by the output inverting circuit 150 when reading from a memory cell coupled to a negative bit line input/output node of the corresponding sense amplifier. As such, the data out signal 157 comprising the passed data output value is delivered as the data output. Also, the data_bar output value of the corresponding data_bar signal 169 is passed by the output inverting circuit 150 to generate a passed data_bar signal 169 as the data_bar output signal 159 comprising the passed data_bar output value.

Figure 2A:
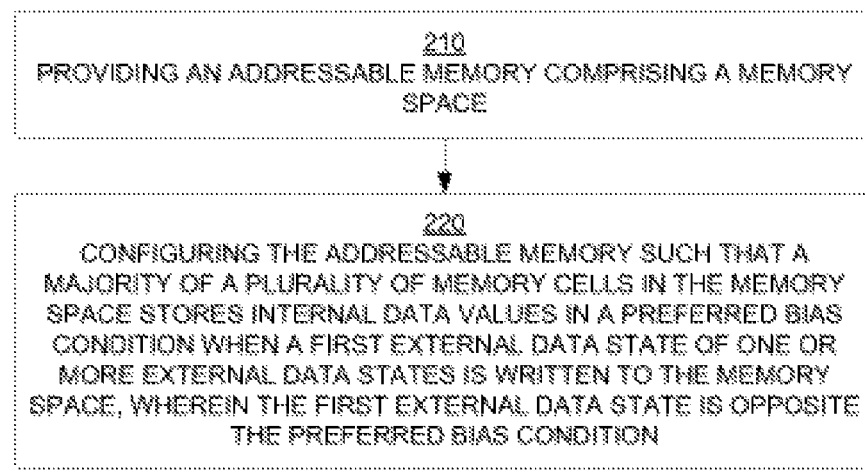
FIG. 2A is a flow chart illustrating a method of storing, wherein data is stored in memory cells of a memory array in a preferred bias condition when storing a first external data state of an input signal, in accordance with one embodiment of the invention.

FIG. 2A is a flow chart 200 illustrating a method of storing, wherein selected data is stored in memory cells of a memory array in a preferred bias condition, in accordance with one embodiment of the invention. In one embodiment, the flow chart 200A is implemented by memory system 100A for purposes of storing data into a memory space or array in a preferred bias condition, especially when input signals are delivered to the memory system 100A in an expected state.

At 210, the method includes providing an addressable memory comprising a memory space. For instance, the memory space (e.g., memory array) comprises a plurality of single-ended memory cells, wherein the memory cells have a preferred bias condition, as previously described. For example, in one implementation, the addressable memory array includes a plurality of DRAM memory cells, wherein the preferred bias condition is an electrical "0", which represents the default state of each of the memory cells. In other implementations, the preferred bias condition is either an electrical "0" or "1", depending on which level gives a lower consumption of power when performing WRITE and/or READ operations.

At 220, the method includes configuring the addressable memory such that a majority of a plurality of memory cells in the memory space stores internal data values in a preferred bias condition for selected data. In particular, external data values of an input signal having a first data state are stored as internally stored data values in a plurality of memory cells in the preferred bias condition. The external data values of the input signal comprise one or more data states (e.g., electrical "0", electrical "1", states between "0" and "1", etc.). In one embodiment, the internally stored data values are stored in the memory cells throughout the memory space in the preferred bias condition in a majority of the cases. In one embodiment, under normal memory cell operating conditions, it is expected that a majority of external data values of a first state are stored as internally stored data values in memory cells in the preferred bias condition.

Furthermore, the first external data state is opposite the preferred bias condition, in one embodiment. For instance, in one implementation, the memory space includes a plurality of DRAM memory cells, wherein the preferred bias condition is an electrical "0", which represents the default state of the memory cells. In that case, the first external data state is an logical "1", which is opposite the preferred bias condition. As such, external data values having the first external data state of logical "1" are stored in memory cells throughout the memory space as an electrical "0". In this manner, memory cells in the memory space are storing internally stored data values at an equilibrium state that is less likely to fail. In still another embodiment, the first external data state is similarly biased as the preferred bias condition.

In one embodiment, in the DDR4 SDRAM implementation of a memory array, an input signal delivered to the addressable memory is expected to have external data values that are statistically biased towards an electrical "1", given that the I/Os have a high voltage ("1") termination in an effort to optimize power. That is, the plurality of external data values of the input signal has a higher probability of being in the first external data state. However, optimization of power comes at a cost of increasing the risk of soft errors and other data loss due to non-defect errors, in the case of an n-channel DRAM implementation. To address the increased risk, under embodiments of the present invention, external data values of electrical "1" are stored into memory cells of the addressable memory as electrical "0" a majority of the time. In that manner, over time, memory cells in the memory space will be statistically less likely to fail since it is storing data biased towards the preferred bias condition a majority of the time.

More specifically, the external data values having a first data state are modified, such that they are delivered to memory cells throughout the memory space for storage as internally stored data values in the preferred bias condition. For instance, external data values in the input signal are inverted where appropriate for storage to memory cells in the preferred bias condition, as will be further described below.

For purposes of illustration only, embodiments of the present invention are described within the context of storing data into a memory array comprising DRAM memory cells for purposes of optimizing data retention and providing soft error rate immunity. However, other embodiments of the present invention are well suited to storing data in any type of memory array consisting of any type of memory cell (e.g., flash memory transistor, fin field effect transistor (FinFET), resistive memory transistor, recessed channel array transistor, etc.), wherein the preferred bias condition is defined by any optimization factor (e.g., low power consumption, quicker response times, improved quality of service, etc.). For instance, in other embodiments of the invention, the preferred bias condition is associated with a low power WRITE and/or READ operation, wherein one state is characterized by a lower consumption of power when performing WRITE and READ operations when compared to another state.

Figure 2B:
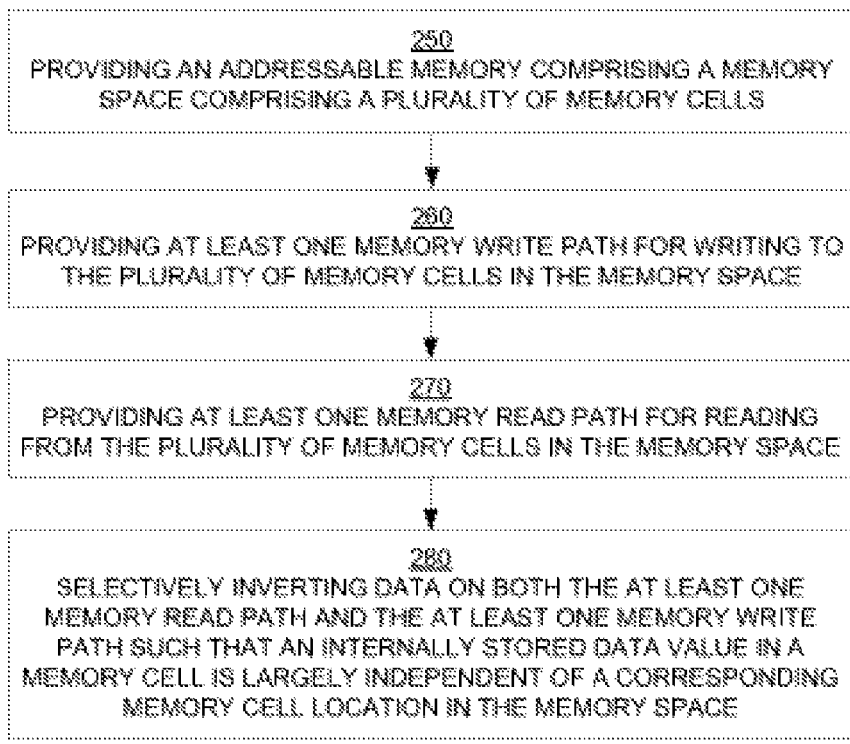
FIG. 2B is a flow chart illustrating another method of storing, wherein input and output data is selectively inverted such that storage of an internally stored data value is independent of the location in the memory space or array, in accordance with one embodiment of the present disclosure.

FIG. 2B is a flow chart 200B illustrating another method of storing, wherein input and output data is selectively inverted such that storage of an internally stored data value is independent of the location in the memory space or array, in accordance with one embodiment of the present disclosure. In one embodiment, the flow chart 200B is implemented by memory system 100A for purposes of storing data into a memory space or array in a preferred bias condition, especially when input signals are delivered to the memory system 100A in an expected state.

At 250, the method includes providing an addressable memory comprising a memory space, wherein the memory space (e.g., memory array) comprises a plurality of memory cells. For example, in one implementation, the addressable memory includes a plurality of DRAM memory cells. Other embodiment are well suited to supporting other types of memory systems including other types of memory cells.

At 260, the method includes providing at least one memory write path for writing to the plurality of memory cells in the addressable memory and memory space. For instance, a memory write path is configured for writing to one or more memory cells in the memory space. Additionally, at 270, the method includes providing at least one memory read path for reading from the plurality of memory cells in the addressable memory and memory space. For instance, a memory read path is configured for reading from one or more memory cells in the memory space.

At 280, the method includes selectively inverting data on both the at least one memory read path and the at least one memory write path such that an internally stored data value in a memory cell is largely independent of a corresponding memory cell location in the memory space. That is, for a given external data state of an external data value of an input signal, the corresponding internally stored data value is independent of the address of the memory cell selected for storage. For instance, when a corresponding external data value of an input signal is delivered for storage in the addressable memory, that external data value is stored as the internally stored data value no matter which memory cell in the memory space is selected for storage. As such, storage of the external data value as the internally stored data value is largely independent of memory cell location.

In one embodiment, the data is selectively inverted such that the internally stored data value in the memory cell is predominantly opposite of one or more states provided at an external output and an external input. For instance, one or more external data values of an input signal having a first data state are stored in memory cells of the memory space as internally stored data values that are opposite the first data state. As an example, the internally stored data values are consistent with a preferred bias condition, as previously described, and as such, the first external data state is opposite the preferred bias condition. Further, when reading from those same memory cells, that are storing internally stored data values opposite the first data state of corresponding external data values, the data is manipulated such that the output values at an external output are opposite the internally stored data values, and align with the original, external data values of the input signal.

In one embodiment, the addressable memory is configured such that a majority of a plurality of memory cells in the memory space stores internal data values in a preferred bias condition when a first external data state of one or more external data states is written to said memory space, wherein said first external data state is opposite said preferred bias condition. The external data values comprise one or more data states, such as, electrical "0", electrical "1", states between "0" and "1", etc.

FIGS. 3-6 in combination are circuit diagrams, flow diagrams, and tables illustrating an open bit-line architecture memory array in a memory system that is configured to store data in memory cells of a memory array in a preferred bias condition, in embodiments of the present invention. Also, the systems and methods disclosed in FIGS. 3-6 are implemented within memory system 100A of FIG. 1A and by the flow diagrams 200A of FIG. 2A and 200B of FIG. 2B, in embodiments of the present invention.

In particular, FIG. 3A is an exemplary layout of an open bit line memory array 300A that is configured to store data in memory cells in a preferred bias condition, in accordance with one embodiment of the present disclosure. In one embodiment, an input signal including a plurality of external data values is delivered to the memory array 300A such that the external data values have an expected bias. As an example, memory array 300A is implementable within memory system 100A of FIG. 1A.

As shown in FIG. 3A, a data in signal 301 is delivered to an input inverting circuit 310 over path 311. Also, a data_bar in signal 303 is delivered to the input inverting circuit 310 over path 316. The data in signal 301 and data_bar in signal 303 are generated from a differential signal generator (not shown) based on an input signal, in one embodiment. The input inverting circuit 310 either inverts or passes the data in signal 301 and data_bar in signal 303 through the appropriate circuit path depending on which memory cell the original input signal is assigned for storage. In particular, for an open bit-line architecture, the data in signal 301 and data_bar in signal 303 are inverted or passed depending on which side (the A-side/left side or B-side/right side) of the array the targeted memory cell is located, as will be further described in relation to FIGS. 4-6. For instance, the data in signal 301 is inverted through the input inverting circuit 310 by inverter 306 over paths 311 and 313 in the input inverting circuit 310 if the targeted memory cell is located on the left side, or A-side 380A of the memory array 300A by activating pass gate 304 via a control signal from an address decoder via node 392. The inverted data signal is delivered to the memory array from circuit 310 through pass gate 304 and over path 320. Also, a data_bar in signal 303 is inverted through the input inverting circuit 310 by inverter 307 over paths 316 and 317 by activating transistor 308 via a control signal from an address decoder delivered to node 392. On the other hand, the data in signal 301 is passed through the input inverting circuit 310 over paths 311 and 320 if the targeted memory cell is located on the right side, or B-side 380B of the memory array 300A by activating pass gate 305 via a control signal from an address decoder via node 391. The passed data signal is delivered to the memory array from circuit 310 through pass gate 305 and over path 320. Also, the data_bar in signal 303 is passed through the input inverting circuit 310 over paths 316 and 330 by activating transistor 309 via a control signal from an address decoder delivered to node 391.

Signals from the input inverting circuit 310 are delivered to a plurality of sense amplifiers 350, including sense amplifiers 350A-D. In general, sense amplifiers are coupled to bit lines in the memory array 300A for selection of a particular memory cell for purposes of performing WRITE and READ operations. For instance, path 320 is coupled to a bi-directional data input/output node (e.g., 351 of sense amplifier 350A) on the positive side of each of the plurality of sense amplifiers 350 in order to deliver the data in signal 301 after manipulation by the input inverting circuit 310 to either the A-side sub-array 380A, or B-side sub-array 380B. Also, path 330 is coupled to a bi-directional data_bar input/output node (e.g., 356 of sense amplifier 350A) on the negative side of each of the plurality of sense amplifiers in order to deliver the data_bar in signal 303 after manipulation by the input inverting circuit 310 to either the A-side sub-array 380A, or B-side sub-array 380B.

Additionally, memory array 300A includes a plurality of memory cells, each of which is associated with a preferred bias condition, as previously described. For example, and for purposes of illustration, in the implementation of a DRAM memory cells in the memory array 300A, a preferred bias condition is the default state, or an electrical "0", which provides greater immunity to data loss due to noise, soft error rates, leakage, and other non-defect factors that could impact data integrity.

In FIG. 3A, the plurality of memory cells is arranged in an open-bit line architecture. As shown, memory array 300A includes two sub-arrays, such as, the A-side sub-array 380A configured on the left of the array, and the B-side sub-array 380B configured on the right side of the array. Each of the sub-arrays includes M rows and N columns of memory cells, such as, memory cell 361A or memory cell 363A.

Each of the N columns includes a corresponding bit line, wherein bit lines are used to write to or read data from memory cells in the A-side sub-array 380A, and the B-side sub-array 380B. In particular, addressing circuitry (not shown) controls column decoders (e.g., Y-select 390 of sense amplifier 350A) and/or sense amplifiers 350A-D that are coupled to bit lines 371A, 372A, 373A, and 374A on the A-side sub array 380A. Also, addressing circuitry controls column decoders and/or sense amplifiers 350A-D that are coupled to bit lines bar 371B, 372B, 373B, and 374B on the B-side sub array 380B. For instance, each of the sense amplifiers 350A-D includes a positive bit line input/output node (e.g., node 352 for sense amplifier 350A) and a negative bit line bar input/output node (e.g., port 357 for sense amplifier 350A) coupled to corresponding bit lines accessing memory cells in the array. It is understood that each of the A-side sub-array 380A and the B-side sub-array 380B may include any number of bit lines.

Each of the M rows includes a corresponding word line, wherein word lines are used to select a particular row of memory cells in either sub-arrays 380A or 380B by activating FETs in that particular row, for purposes of writing, reading, and erasing. For instance, for the A-side sub-array 380A, word line 340 is used to access memory cells (e.g., 361A-D) in the corresponding row 366. Also, for B-side sub-array 380B, word line 345 is used to access memory cells (e.g., 363A-D) in the corresponding row 367 of memory cells. It is understood that each of the A-side sub-array 380A and the B-side sub-array 380B may include any number of word lines, though only one word line for each array is shown.

More particularly, row decoders and column decoders are used to selectably access memory cells in either of the A-side sub-array 380A or B-side sub-array 380B in response to address signals provided by an external controller (e.g., memory controller).

Memory array 300A also includes an output inverting circuit 388 which manipulates the data read from the memory cells appropriately, depending on which side of the memory array 300A (e.g., A-side 380A or B-side 380B) a memory cell was accessed for reading. That is, the signal read from a memory cell will be manipulated (e.g., inverted) depending on whether or not a corresponding input signal (e.g., data in 301 or data_bar in 303) was inverted. For instance, the output inverting circuit 388 receives a data signal over path 320 from the bi-directional data input/output node (e.g., node 351) on the positive side of a corresponding sense amplifier 350A-D, and a data_bar signal over path 330 from the bi-directional data_bar input/output node (e.g., node 356) on the negative side of a corresponding sense amplifier 350A-D. Output inverting circuit 388 either inverts or passes the received data signals from a corresponding sense amplifier through the appropriate circuit path depending on which memory cell the original input signal was assigned for storage. As shown, a data signal over path 320 is inverted through the output inverting circuit 388 over paths 320 and 381 by activating transistor 382 via a control signal from an address decoder delivered to node 399. The data signal over path 320 is passed through the output inverting circuit 388 by activating transistor 384 via a control signal from an address decoder delivered to node 398. Also, a data_bar signal over path 330 is inverted through the output inverting circuit 388 over paths 330 and 386 by activating transistor 387 via a control signal from an address decoder delivered to node 399. The data_bar signal is passed through the output inverting circuit 388 over path 330 by activating transistor 389 via a control signal from an address decoder delivered to node 398.

Figure 3B:
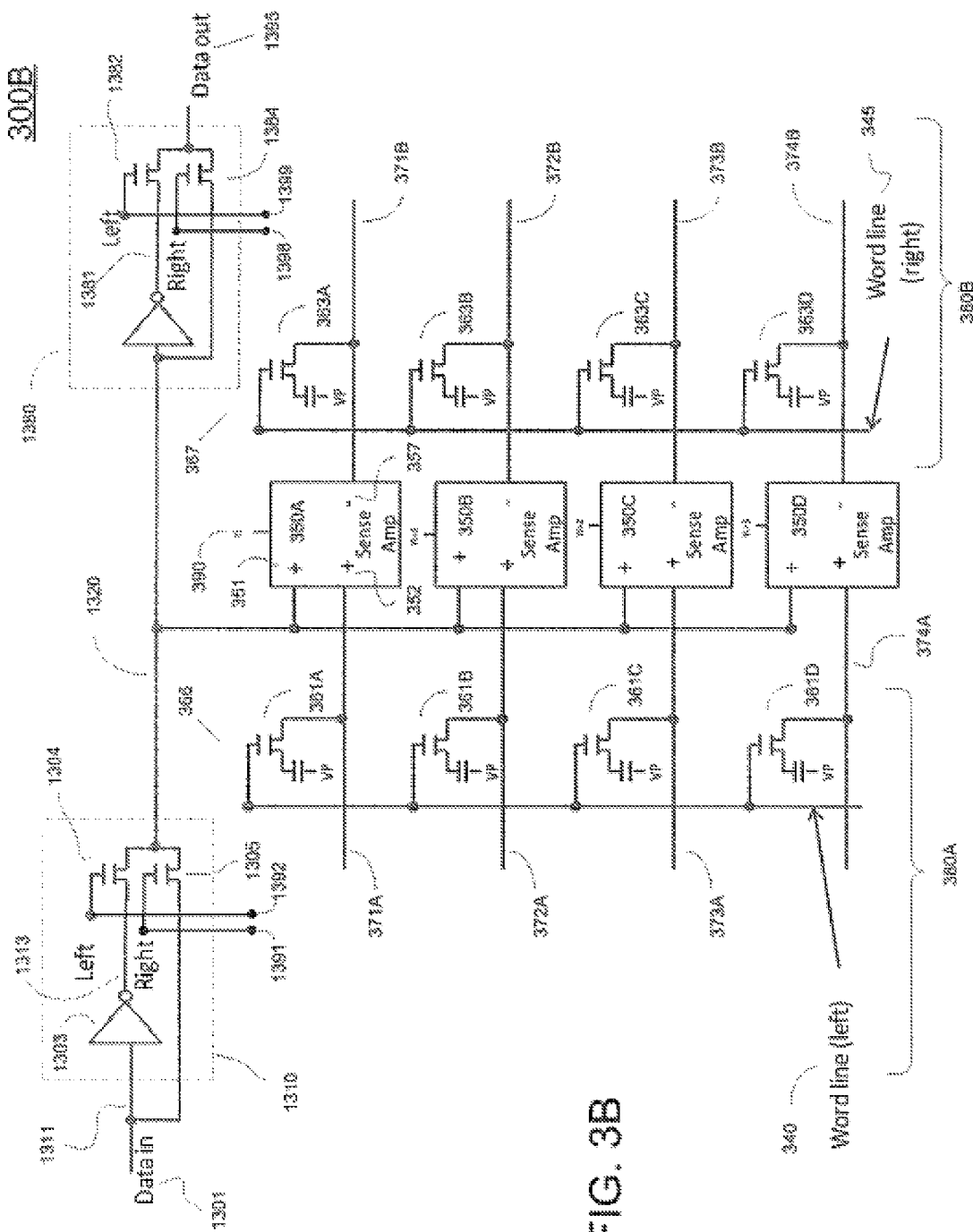
FIG. 3B is a layout of an open bit line memory array, wherein a single data input signal delivers external data values to be stored in memory cells through one or more positive sides of one or more sense amplifiers, wherein the memory array is configured to store selected data in memory cells in a preferred bias condition, in accordance with one embodiment of the present disclosure.

FIG. 3B is a layout of an open bit line memory array 300B, wherein a single data input signal delivers external data values to be stored in memory cells through one or more positive sides of one or more sense amplifiers, wherein the memory array is configured to store selected data in memory cells in a preferred bias condition, in accordance with one embodiment of the present disclosure. In one embodiment, an input signal including a plurality of external data values is delivered to the memory array 300B such that the external data values have an expected bias. As an example, memory array 300B is implementable within memory system 100A of FIG. 1A.

As shown, the open bit line memory array 300B is similar in configuration to the open bit line memory array 300A of FIG. 3A, with some exceptions. As such, in general, similarly numbered elements perform the same functionality in either memory array 300A or 300B. For instance, the memory array 300B includes a plurality of memory cells arranged in an open-bit line architecture including two sub-arrays, such as, the A-side sub-array 380A configured on the left of the array, and the B-side sub-array 380B configured on the right side of the array. Each of the sub-arrays include M rows and N columns of memory cells, such as, memory cell 361A or memory cell 363A. Each of the N columns includes a corresponding bit line, wherein bit lines are used to write to and read data from memory cells in the A-side sub-array 380A, and the B-side sub-array 380B. Each of the M rows includes a corresponding word line, wherein word lines are used to select a particular row of memory cells in either sub-arrays 380A or 380B by activating FETs in that particular row, for purposes of writing, reading, and erasing. Addressing circuitry (not shown), row decoders, and column decoders are used to selectably access memory cells in either of the A-side sub-array 380A or B-side sub-array 380B in response to address signals provided by an external controller (e.g., memory controller).

The open bit line memory array 300B is configured to receive an input signal in the form of a data in signal 1301. Instead of generating complementary data input signals through a differential signal generator, as is implemented in FIG. 3A, only one data in signal 1301 is used to deliver data values for storage into the array 300B. As shown in FIG. 3B, data in signal 1301 is delivered to an input inverting circuit 1310 over path 1311. The input inverting circuit 1310 either inverts or passes the data in signal 1301 through the appropriate circuit path depending on which memory cell the original input signal is assigned for storage. For instance, the data in signal 1301 is inverted or passed depending on which side (the A-side/left side or B-side/right side) of the array the targeted memory cell is located, as will be further described in relation to FIGS. 4-6. Specifically, the data in signal 1301 is inverted in the input inverting circuit 1310 by inverter 1303 through paths 1311 and 1313 by activating pass gate 1304 via a control signal from an address decoder via node 1392, if the targeted memory cell is located on the left side, or A-side 380A of the memory array 300B. The inverted data signal is delivered to the memory array from circuit 1310 through pass gate 1304 and over path 1320. Also, the data in signal 1301 is passed without inverting through paths 1311 and 1320 of the input inverting circuit 1310 by activating pass gate 1305 via a control signal from an address decoder via node 1391, if the targeted memory cell is located on the right side, or B-side 380B of the memory array 300B. The passed data signal is delivered to the memory array from circuit 1310 through pass gate 1305 and over path 1320.

Signals from the input inverting circuit 1310 are delivered to a plurality of sense amplifiers 350, including sense amplifiers 350A-D. In general, sense amplifiers are coupled to bit lines in the memory array 300B for selection of a particular memory cell for purposes of performing WRITE and READ operations. For instance, path 1320 is coupled to a bi-directional data input/output node (e.g., 351 of sense amplifier 350A) on the positive side of each of the plurality of sense amplifiers 350 in order to deliver the data in signal 1301 after manipulation by the input inverting circuit 1310 to either the A-side sub-array 380A, or B-side sub-array 380B.

Memory array 300B also includes an output inverting circuit 1380 which manipulates the data read from the memory cells appropriately, depending on which side of the memory array 300B (e.g., A-side 380A or B-side 380B) a memory cell was accessed for reading. That is, the signal read from a memory cell will be manipulated (e.g., inverted or not inverted) depending on whether or not a corresponding input signal (e.g., data in signal 1301) was also inverted or not. For instance, the output inverting circuit 1380 receives a data signal over path 1320 from the bi-directional data input/output node on the positive side of corresponding sense amplifiers 350A-D. Output inverting circuit 1380 either inverts or passes the received data signal through the appropriate circuit path depending on which memory cell was accessed, as will be further described in relation to FIGS. 4-6. Specifically, the data signal from sense amplifiers 350A-D on path 1320 is inverted if the targeted memory cell being read is located on the left side, or A-side 380A of the memory array 300B. For instance, a data signal over path 1320 is inverted through output inverting circuit 1380 and delivered as a data out signal 1395 over paths 1320 and 1381 by activating pass gate 1382 via a control signal from an address decoder via node 1399. Also, the data signal from sense amplifiers 350A-D is passed without inverting through the output inverting circuit 1380 if the targeted memory cell is located on the right side, or B-side 380B of the memory array 300B. For instance, a data signal over path 1320 is passed through output inverting circuit 1380 and delivered as a data out signal 1395 by activating pass gate 1384 via a control signal from an address decoder via node 1398.

Figure 3C:
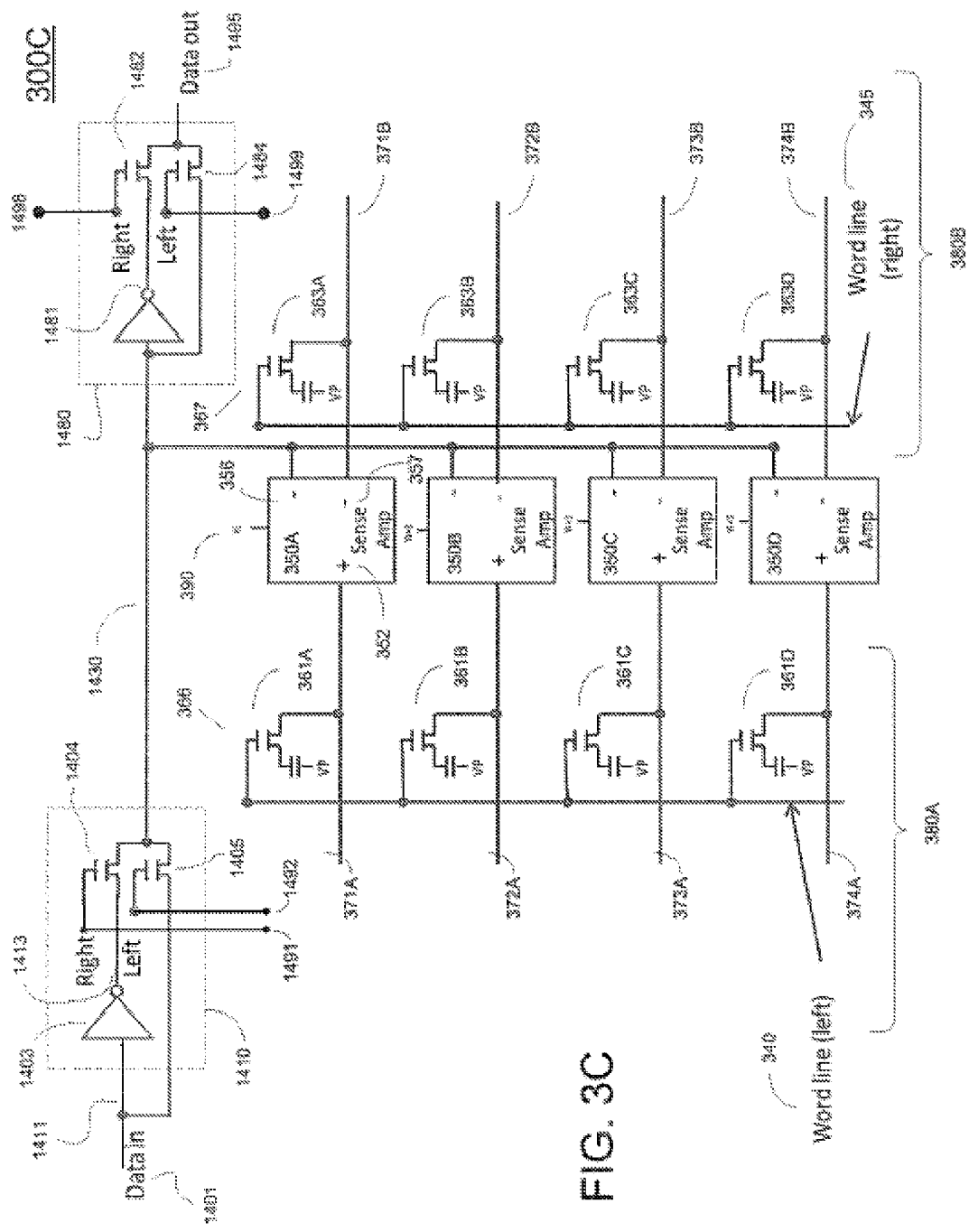
FIG. 3C is a layout of an open bit line memory array, wherein a single data input signal delivers external data values to be stored in memory cells through one or more negative sides of one or more sense amplifiers, wherein the memory array is configured to store selected data in memory cells in a preferred bias condition, in accordance with one embodiment of the present disclosure.

FIG. 3C is a layout of an open bit line memory array 300C, wherein a single data input signal delivers external data values to be stored in memory cells through one or more negative sides of one or more sense amplifiers, wherein the memory array is configured to store selected data in memory cells in a preferred bias condition, in accordance with one embodiment of the present disclosure. That is, the addressable memory is accessed by at least one sense amplifier. In one embodiment, an input signal including a plurality of external data values is delivered to the memory array 300C such that the external data values have an expected bias. As an example, memory array 300C is implementable within memory system 100A of FIG. 1A.

As shown, the open bit line memory array 300C is similar in configuration to the open bit line memory array 300A of FIG. 3A, with some exceptions. As such, in general, similarly numbered elements perform the same functionality in either memory array 300A or 300C. For instance, the memory array 300C includes a plurality of memory cells (e.g., DDR SDRAMs) arranged in an open-bit line architecture including two sub-arrays, such as, the A-side sub-array 380A configured on the left of the array, and the B-side sub-array 380B configured on the right side of the array. Each of the sub-arrays include M rows and N columns of memory cells, such as, memory cell 361A or memory cell 363A. Each of the N columns includes a corresponding bit line, wherein bit lines are used to write to, read data from and erase data from memory cells in the A-side sub-array 380A, and the B-side sub-array 380B. Each of the M rows includes a corresponding word line, wherein word lines are used to select a particular column of memory cells in either sub-arrays 380A or 380B by activating FETs in that particular column, for purposes of writing, reading, and erasing. Addressing circuitry (not shown), row decoders, and column decoders are used to selectably access memory cells in either of the A-side sub-array 380A or B-side sub-array 380B in response to address signals provided by an external controller (e.g., memory controller).

The open bit line memory array 300C is configured to receive an input signal in the form of a data in signal 1401. Instead of generating two data input signals through a differential signal generator, as is implemented in FIG. 3A, only one data in signal 1401 is used to deliver data values for storage into the array 300C. As shown in FIG. 3C, data in signal 1401 is delivered to an input inverting circuit 1410 over path 1411. The input inverting circuit 1410 either inverts or passes the data in signal 1401 through the appropriate circuit path depending on which memory cell the original input signal is assigned for storage. For instance, the data in signal 1401 is inverted or passed depending on which side (the A-side/left side or B-side/right side) of the array the targeted memory cell is located, as shown in FIG. 3C and as further described in relation to FIGS. 4-6. Specifically, the data in signal 1401 is passed without inverting through the input inverting circuit 1410 by activating pass gate 1405 via a control signal from an address decoder delivered to node 1492, if the targeted memory cell is located on the left side, or A-side 380A of the memory array 300C. The passed data in signal 1401 is delivered to the memory array from circuit 1410 through pass gate 1405 and over path 1430. Also, the data in signal 1401 is inverted by inverter 1403 in the input inverting circuit 1410 over paths 1411 and 1413 by activating pass gate 1404 via a control signal from an address decoder delivered to node 1491, if the targeted memory cell is located on the right side, or B-side 380B of the memory array 300C. The inverted data signal is delivered to the memory array from circuit 1410 through pass gate 1404 and over paths 1413 and 1430.

Signals from the input inverting circuit 1410 are delivered to a plurality of sense amplifiers 350, including sense amplifiers 350A-D. In general, sense amplifiers are coupled to bit lines in the memory array 300C for selection of a particular memory cell for purposes of performing WRITE and READ operations. For instance, path 1430 is coupled to a bi-directional data_bar input/output node (e.g., 356 of sense amplifier 350A) on the negative side of each of the plurality of sense amplifiers 350 in order to deliver the data in signal 1401 after manipulation by the input inverting circuit 1410 to either the A-side sub-array 380A, or B-side sub-array 380B.

Memory array 300C also includes an output inverting circuit 1480 which manipulates the data read from the memory cells appropriately, depending on which side of the memory array 300C (e.g., A-side 380A or B-side 380B) a memory cell was accessed for reading. That is, the signal read from a memory cell will be manipulated (e.g., inverted) depending on whether or not a corresponding input signal (e.g., data in signal 1401) was inverted, or more particularly where the accessed memory cell is located. For instance, the output inverting circuit 1480 receives a data signal over path 1430 from the bi-directional input/output node located on the negative side of corresponding sense amplifiers 350A-D. Output inverting circuit 1480 either inverts or passes the received data signal through the appropriate circuit path depending on which memory cell was accessed, as will be further described in relation to FIGS. 4-6. Specifically, the received data signal from sense amplifiers 350A-D on path 1430 is passed without inverting if the targeted memory cell being read is located on the left side, or A-side 380A of the memory array 300C. For instance, a data signal over path 1430 is passed through output inverting circuit 1480 by activating pass gate 1484 via a control signal from an address decoder delivered to node 1499. The passed data signal is delivered as a data out signal 1495 through pass gate 1484. Also, the data signal from sense amplifiers 350A-D is inverted if the targeted memory cell is located on the right side, or B-side 380B of the memory array 300C. For instance, a data signal over paths 1430 and 1481 is inverted through output inverting circuit 1480 by activating pass gate 1482 via a control signal from an address decoder delivered to node 1498. The inverted data signal is delivered as a data out signal 1495 through pass gate 1482.

Figure 4A:
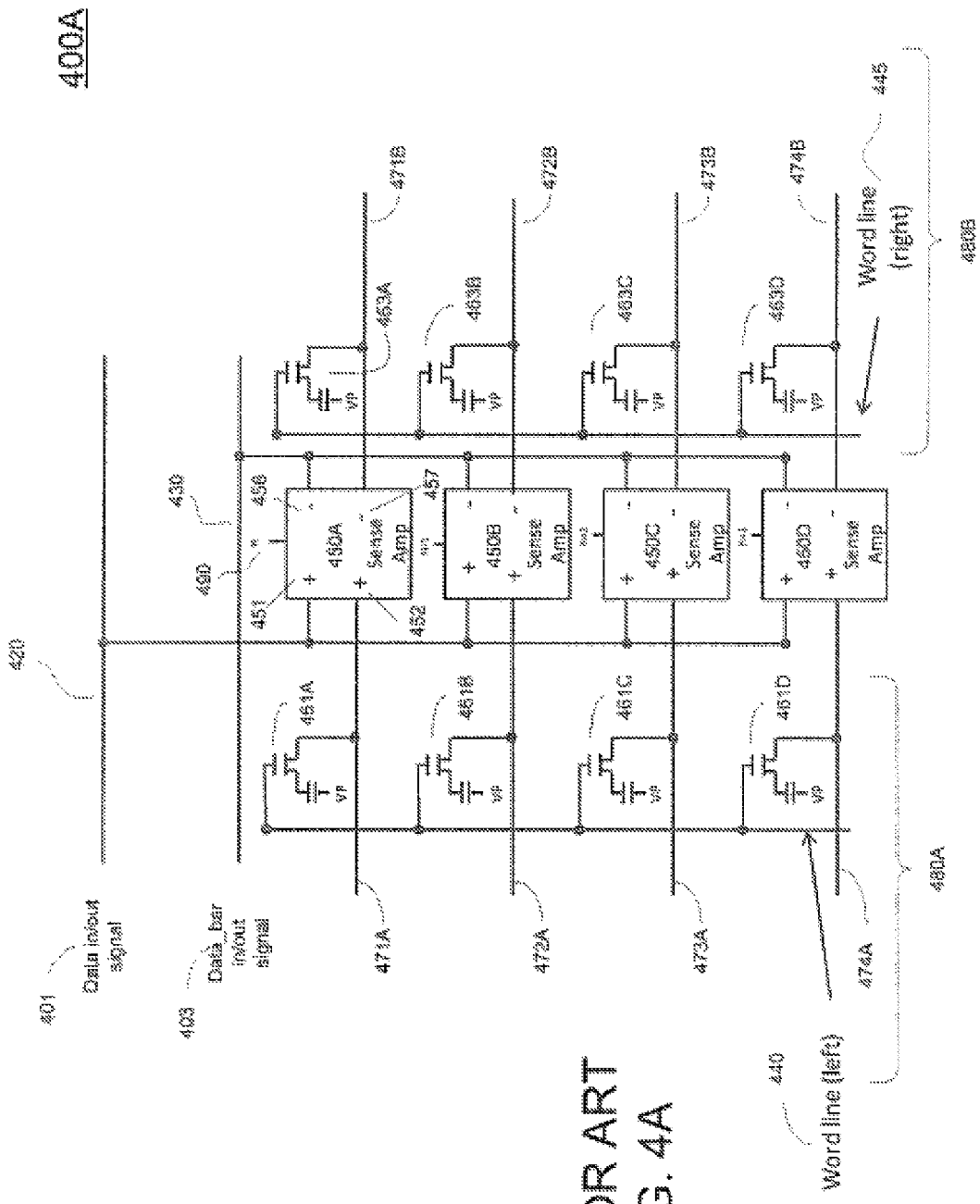
FIG. 4A is a layout of a conventional open bit line memory array, in accordance with one embodiment of the invention.
Figure 4B:
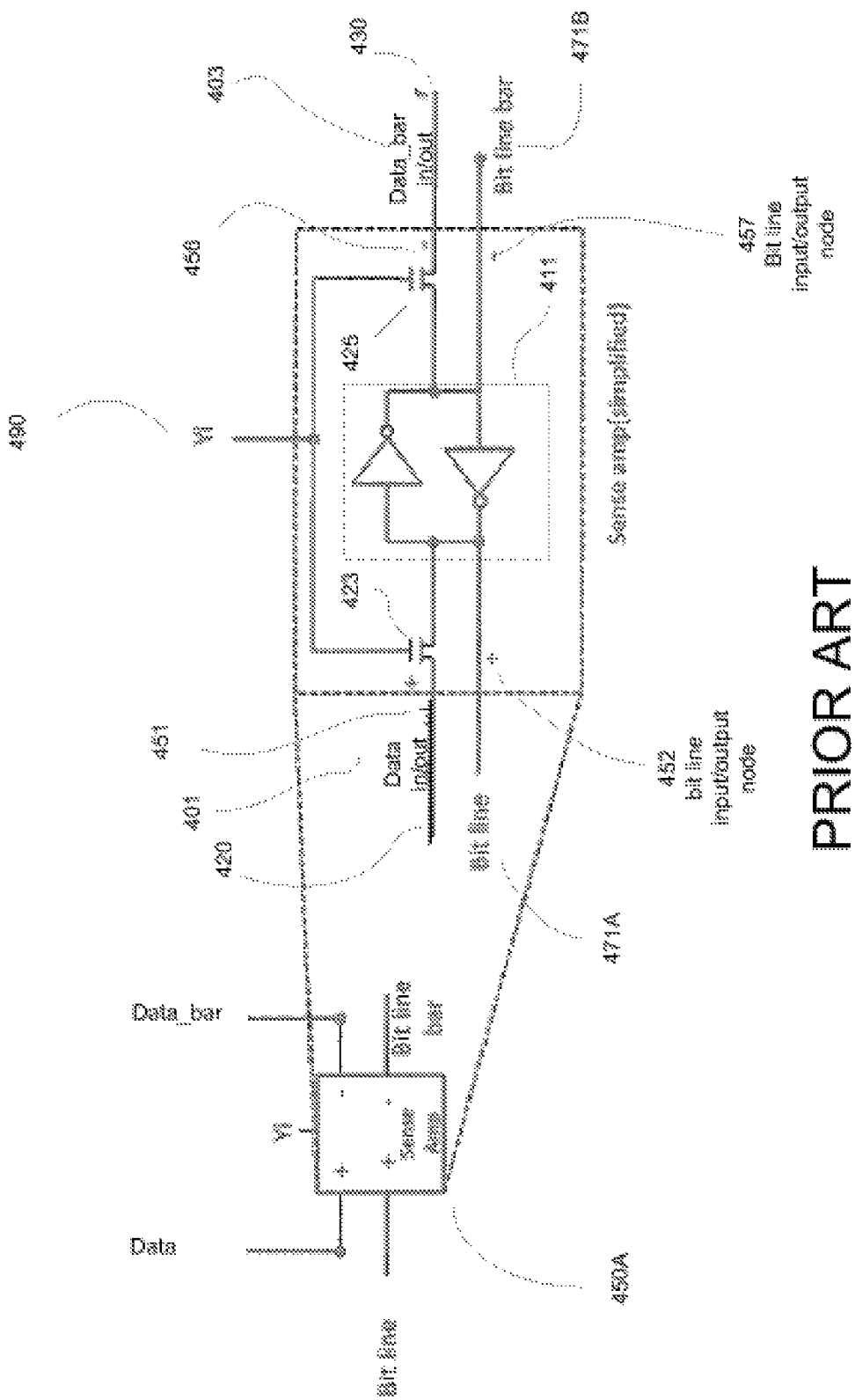
FIG. 4B is an illustration of a sense amplifier implemented within the memory array of FIG. 4A.

PRIOR ART FIGS. 4A-B in combination are circuit diagrams illustrating a conventional open bit line architecture memory array and a conventional sense amplifier. In particular, FIG. 4A is a layout of an open bit line memory array 400A that is configured to store data in memory cells. FIG. 4B is a detailed illustration of a sense amplifier that is implemented within the open bit line memory array 400A.

Turning now to FIG. 4A, an input signal (not shown) includes a plurality of external data values that is delivered to the memory array 400A for storage. For the open bit line architecture, a data in/out signal 401 is delivered to positive sides of sense amplifiers providing access to the memory array 400A over path 420. Also, the data_bar in/out signal 403 is delivered to the negative sides of sense amplifiers providing access to the memory array 400A over path 430.

In general, sense amplifiers are coupled to bit lines in the memory array 400A for selection of a particular memory cell for purposes of performing WRITE and READ operations. For instance, path 420 is coupled to a positive bi-directional data input/output node (e.g., 451 of sense amplifier 450A) on the positive side of each of the plurality of sense amplifiers 450 in order to deliver the data in/out signal 401 to either the A-side sub-array 480A or B-side sub-array 480B. Also, path 430 is coupled to a negative bi-directional data input/output node (e.g., 456 of sense amplifier 450A) on the negative side of each of the plurality of sense amplifiers in order to deliver the data_bar in/out signal 403 to either the A-side sub-array 480A or B-side sub-array 480B.

Memory array 400A includes a plurality of memory cells arranged in an open bit line architecture. The memory array 400A includes two sub-arrays, such as, the A-side sub-array 480A configured on the left of the array, and the B-side sub-array 480B configured on the right side of the array. Each of the sub-arrays includes M rows and N columns of memory cells, such as, memory cell 461A or memory cell 463A. Row decoders and column decoders are used to selectably access memory cells in either of the A-side sub-array 480A or B-side sub-array 480B in response to address signals provided by an external controller (e.g., memory controller).

Each of the N columns includes a corresponding bit line, wherein bit lines are used to write to or read from memory cells in the A-side sub-array 480A and the B-side sub-array 480B. In particular, addressing circuitry (not shown) controls column decoders (e.g., Y-select 490 of sense amplifier 450A) and/or sense amplifiers 450A-D that are coupled to bit lines 471A, 472A, 473A, and 474A on the A-side sub-array 480A. Also, addressing circuitry controls column decoders and/or sense amplifiers 450A-D that are coupled to bit bar lines 471B, 472B, 473B, and 474B on the B-side sub-array 480B. For instance, each of the sense amplifiers 450A-D includes a positive bit line input/output node (e.g., node 452 for sense amplifier 450A) and a negative bit line bar input/output node (e.g., node 457 for sense amplifier 450A) coupled to corresponding bit lines accessing memory cells in the array.

Each of the M rows includes a corresponding word line, wherein word lines are used to select a particular row of memory cells in either sub-arrays 480A or 480B by activating FETs in that particular row. For instance, word line 440 is used to access memory cells (e.g., 461A-D) of the A-side sub-array 480A. Also, word line 445 is used to access memory cells (e.g., 463A-D) of B-side sub-array 480B.

In the conventional memory array 400A, internally stored data values are dependent on a corresponding memory cell location in memory space. For instance, when a corresponding external data value of an input signal is delivered for storage in the addressable memory, the internally stored data value is dependent on which side of the memory array the targeted memory cell is located in an open bit line architecture, and whether the memory cell is accessed via an even or odd word line in a folded bit line architecture. As an illustration, in the open bit line architecture, an external value of 1 delivered through the data in/out signal 401 is stored as an electrical 1 to memory cells located on the A-side sub-array 480A, but stored as an electrical 0 to memory cells located on the B-side sub-array 480B.

PRIOR ART FIG. 4B is a more detailed illustration of the differential sense amplifiers 450A-D, known in the art and shown at a block level in FIG. 4A. The sense amplifier shown in FIG. 4B is also implementable within the memory arrays 300A-C of FIG. 3A-C and memory array 700 of FIG. 7, in embodiments of the present invention. The sense amplifier shown in FIG. 4B exhibits a differential nature, and typically memory cells may be coupled to either the positive side of the sense amplifier or negative side of the sense amplifier depending on the location of the memory cells. In the conventional open bit line architecture shown in FIG. 4A, the coupling node may depend on the array location (left or right). In a folded bit line architecture, the polarity of the node may depend on the word line location (for example, odd or even), the bit line location (for example odd or even), or a combination of the row and bit line locations. For example, in memory cells on one side of a memory array (e.g., coupled to a positive node of the sense amplifier in an open bit-line architecture), or memory cells coupled to a bit line (e.g., coupled to an even word line of a folded bit-line architecture) are stored true, and memory cells on the opposite side of the memory array (e.g., coupled to a negative node of the sense amplifier in an open bit-line architecture), or memory cells coupled to a bit line bar (e.g., coupled to an odd word line of a folded bit-line architecture) are stored as a complement. Other commonly known components of the sense amplifier are not shown such as, pre-chargers, isolation transistors from the bit lines etc.

For instance, as shown, sense amplifier 450A is selected by the Y-select 490, which activates transistors 423 and 425. With the embodiment shown in FIG. 4A, path 420 delivers the data to bi-directional data input/output 451. In FIG. 4B, if the column selector Yi 490 is high, transistor 423 will be on, and the signal is shared between the positive bi-directional data input/output 451 and the positive bit line input/output 452. Also, path 430 delivers the data_bar in/out signal 403. If the column selector is high, transistor 425 will be on, and the signal is shared between the negative bi-directional data input/output 456 and the negative bit line bar input/output 457. In some embodiments, a column select is not required in the sense amplifier 450A, such that column selection is performed outside of the sense amplifier 450A. In alternate embodiments, there may be an isolation transistor between a sense amplifier and corresponding bit lines.

Figure 5A:
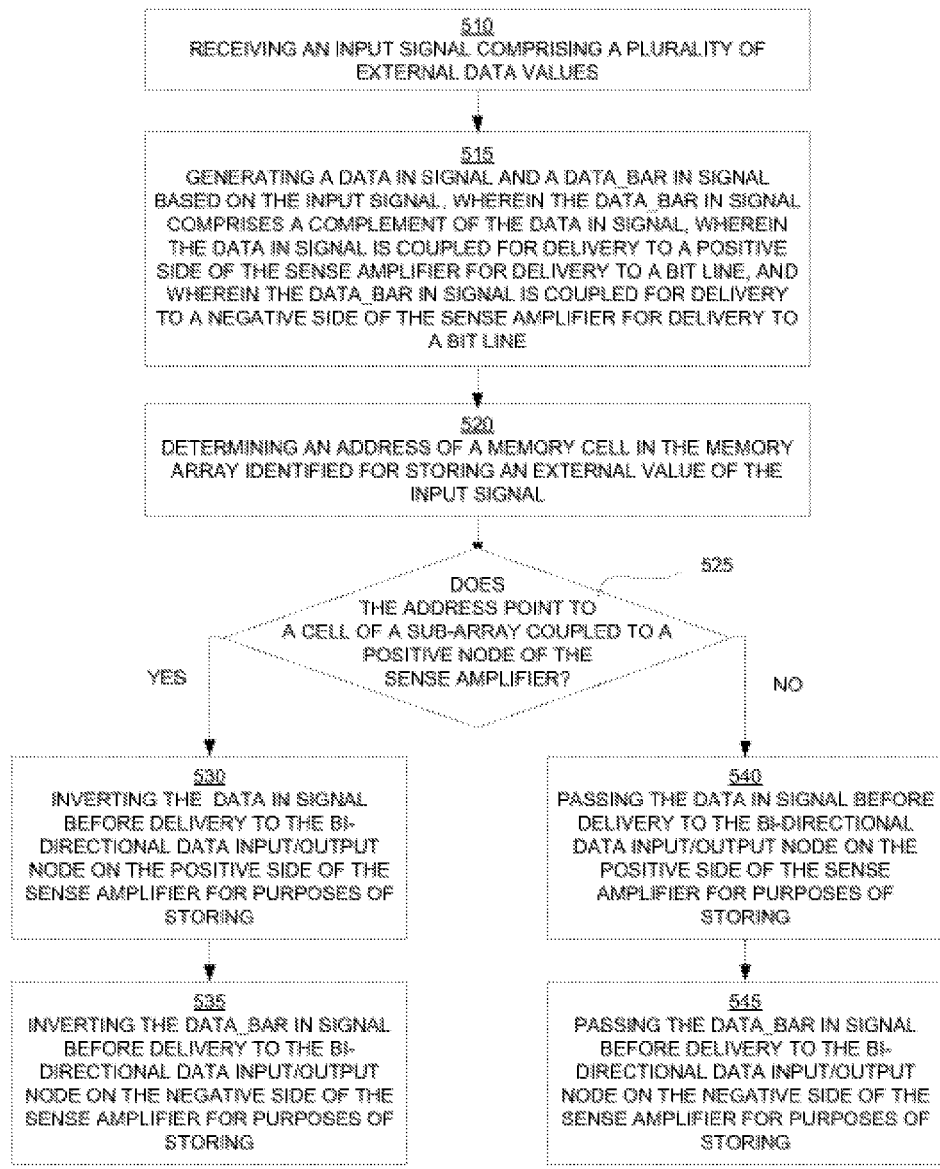
FIG. 5A is a flow chart illustrating a method of storing data into an open bit line memory array, wherein selected data is stored in memory cells in a preferred bias condition, in accordance with one embodiment of the invention.

FIG. 5A is a flow chart 500A illustrating a method of storing data into an open bit line memory array, wherein selected data is stored in memory cells in a preferred bias condition, in accordance with one embodiment of the invention. For instance, flow chart 500A is implemented within memory system 100A of FIG. 1A and memory arrays 300A-C of FIGS. 3A-C, in embodiments.

At 510, the method includes receiving an input signal. For example, the input signal is delivered from a memory controller for purposes of storing into a memory cell in a memory array. The input signal comprises one or more external data values, wherein the data values may further comprises one or more data states (e.g., electrical "0", electrical "1", etc.).

At 515, the method includes generating a data in signal and a data_bar in signal based on the input signal. In one implementation, a differential signal generator (e.g., generator 110) is configured to generate the data in signal and a data_bar in signal. As previously described, the data_bar in signal comprises a complement of the data in signal. Moreover, the data in signal is coupled for delivery to a bi-directional data input/output node on the positive side of a sense amplifier, and the data_bar in signal is coupled for delivery to a bi-directional data input/output on the negative side of the sense amplifier. In one embodiment, the data in signal and the data_bar in signal are coupled to the sense amplifier through an input inverting circuit.

At 520, the method includes determining an address of a memory cell in the memory array that is identified for storing the input signal. For instance, external address circuitry (e.g., located in a memory controller) determines the location of the identified memory cell and outputs address signals controlling, in part, row decoders, column decoders, and sense amplifiers for accessing the identified memory cell.

At 525, the method includes determining whether the address points to a memory cell of a sub-array coupled to a positive node (e.g., positive bit line input/output node) of the sense amplifier. In other words, the method determines which side (e.g., A-side or B-side) of the memory array the identified memory cell is located. In one embodiment, the address of the memory cell includes a bit identifier indicating which side of the memory array it is located. For instance, a portion of an address " . . . 011-1-0 . . . " includes a "1" to indicate that the memory cell is located on the A-side. On the other hand, a similar address pointing to a similarly located memory cell, but on the B-side may be associated with an address " . . . 011-0-0 . . . " that includes a "0" to indicate location on the B-side. Other embodiments are well suited to other addressing methods and means for indicating which side of the memory array a memory cell is located.

When the address points to a memory cell located on the A-side sub-array (e.g., left side or A-side sub-array 380A of FIG. 3A), the process proceeds to block 530. In particular, the A-side sub-array is coupled to a positive node (e.g., positive bit line input/output node) of the sense amplifier. That is, the address points to a memory cell to be written that is coupled to a bit line that is further coupled to a positive or true side of a corresponding sense amplifier. In this case, the method includes inverting the data in signal before delivery to the bi-directional data input/output node, which when activated shares the same node as the positive bit line input/output node of the sense amplifier for purposes of storing. For illustration, looking to FIG. 3A, when storing to a memory cell located in the A-side sub-array 380A, the left path 313 is activated by pass gate transistor 304, such that the data in signal 301 is inverted by inverter 306, and outputted onto path 320 for delivery to the corresponding sense amplifier. The inverted data signal is delivered to the memory array from circuit 310 through pass gate 304 and over path 320. Further, the sense amplifier (e.g., amplifier 350A) passes the data signal received at the bi-directional data input/output node 351 to the positive bit line input/output node 352 for delivery to the selected memory cell on the A-side sub-array 380A.

Additionally, the method also includes inverting the data_bar in signal before delivery to the bi-directional data input/output node on the negative/right side of a corresponding sense amplifier for purposes of storing. That is, when an address points to a memory cell that is coupled to a bit line that is further coupled to a true side (e.g., positive bit line input/output node) of a corresponding sense amplifier, the data input value of the data in signal is inverted to generate an inverted data input value that is stored. For illustration, looking to FIG. 3A, when storing to a memory cell located in the A-side sub-array 380A, the left path 317 is activated by transistor 308, such that the data_bar in signal 303 is inverted by inverter 307, and outputted onto path 330 for delivery to the corresponding sense amplifier. The inverted data signal is delivered to the memory array from circuit 310 through pass gate 308 and over path 330. Further, the sense amplifier (e.g., amplifier 350A) internally inverts the data signal received at the negative bi-directional data_bar input/output node 356 when sending to the positive bit line input/output node 352 for delivery to the selected memory cell on the A-side sub-array 380A.

On the other hand, when the address points to a memory cell located on the B-side sub-array (e.g., right side or B-side sub-array 380B), the process proceeds to block 540. In particular, the B-side sub-array is coupled to a negative node (e.g., negative bit line input/output node) of the sense amplifier. That is, the address points to a memory cell coupled to a bit line that is further coupled to a negative side of a corresponding sense amplifier. In this case, the method includes passing the data in signal to the bi-directional data input/output node on the positive side of the sense amplifier for storing. For illustration, looking at FIG. 3A, when storing to a memory cell located in the B-side sub-array 380B, the right path 311 is activated by pass gate transistor 305, such that the data in signal 301 is directly outputted onto path 320 for delivery to the corresponding sense amplifier. The passed data signal is delivered to the memory array from circuit 310 through pass gate 305 and over path 320. Further, the sense amplifier (e.g., amplifier 350A) internally inverts the data signal received at the positive bi-directional data input/output node (e.g., node 351) when sending to the negative bit line bar input/output node (e.g., node 357) for delivery to the selected memory cell on the B-side sub-array 380B.

Additionally, the method also includes passing the data_bar in signal to the bi-directional data input/output node on the negative side of a corresponding sense amplifier for purposes of storing at 545. That is, when an address points to a memory cell to be written that is coupled to a bit line that is further coupled to a negative side of a corresponding sense amplifier, the data_bar in signal is passed to the bi-directional data input/output node on the negative side of the sense amplifier. For illustration, looking to FIG. 3A, when storing to a memory cell located in the B-side sub-array 380B, the right path 316 is activated by transistor 309, such that the data_bar in signal 303 is directly passed onto path 330 for delivery to the corresponding sense amplifier. The passed data-bar signal is delivered to the memory array from circuit 310 through pass gate 309 and over path 330. Further, the sense amplifier (e.g., amplifier 350A) passes the data_bar signal received at the negative bi-directional data_bar input/output node (e.g., node 356) to the negative bit line bar input/output node (e.g., node 357) for delivery to the selected memory cell on the B-side sub-array 380B.

Figure 5B:
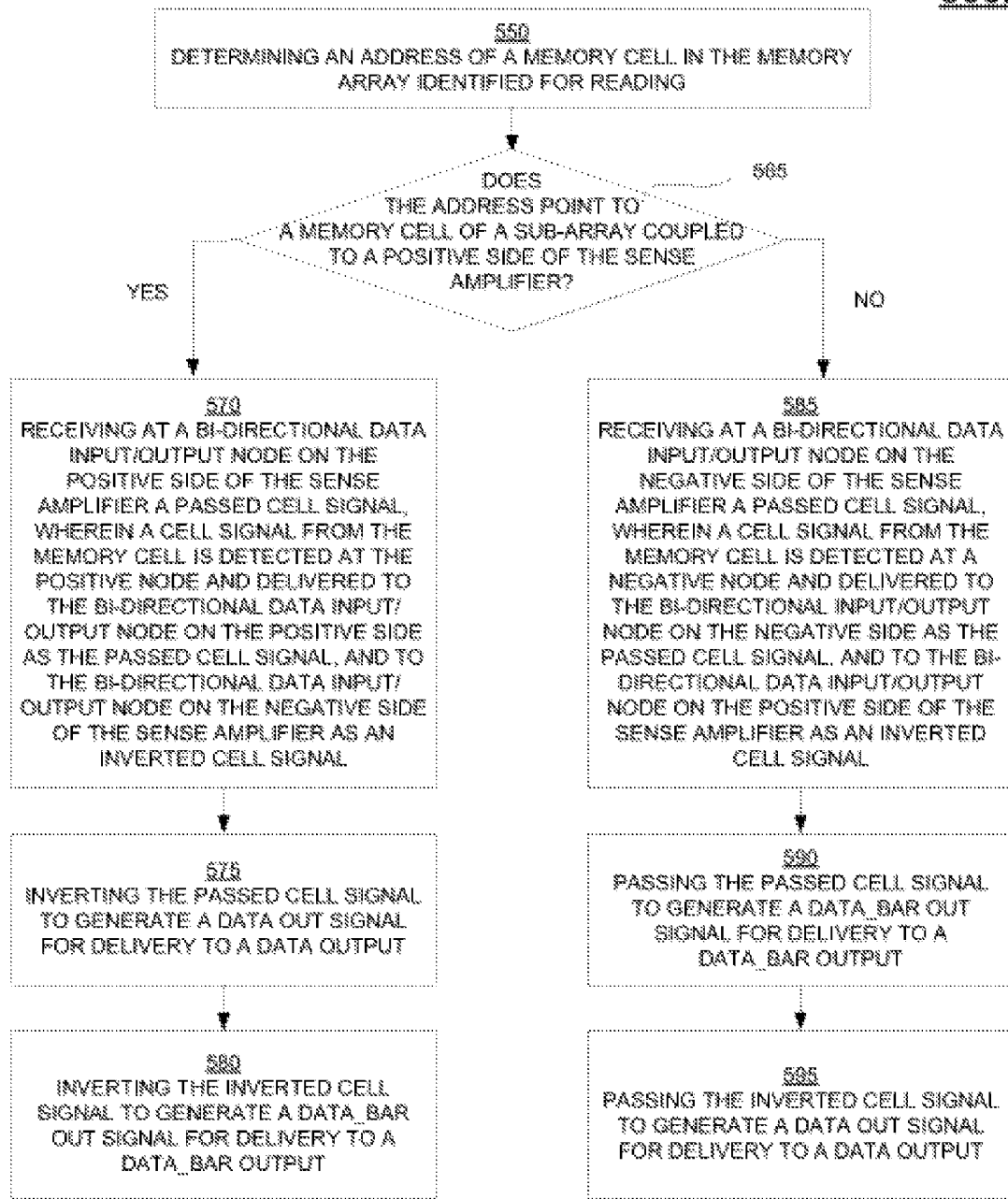
FIG. 5B is a flow chart illustrating a method of reading data from an open bit line memory array, wherein selected data is stored in memory cells of the memory array in a preferred bias condition, in accordance with one embodiment of the invention.

FIG. 5B is a flow chart 500B illustrating a method of reading data from the an open bit-line memory array, wherein selected data is stored in memory cells of the memory array in a preferred bias condition, in accordance with one embodiment of the invention. For instance, flow chart 500B is implemented within memory system 100A of FIG. 1A and memory arrays 300A-C of FIGS. 3A-C, where appropriate, in embodiments.

In particular, at 550, an address of a memory cell in the memory array is identified for reading. That is, it is determined whether the memory cell identified for reading is coupled to a positive node of a corresponding sense amplifier. For instance, external address circuitry (e.g., located in a memory controller) determines the location of the identified memory cell, and outputs address signals controlling, in part, row decoders, column decoders, and sense amplifiers for accessing the identified memory cell.

At 565, the method includes determining whether the address points to a memory cell of a sub-array coupled to a positive node (e.g., positive bit line input/output node) of a corresponding sense amplifier. In other words, the method determines which side (e.g., A-side or B-side) of the memory array the identified memory cell is located. If the memory cell is coupled to the positive node, the method proceeds to 570, otherwise if the memory cell is not coupled to the positive node, the method proceeds to 585.

Further, at 570, a READ operation is performed on a memory cell located on the A-side of the memory array (e.g., A-side sub-array 380A of FIG. 3A). That is, the method includes receiving at the positive bit line input/output node of the sense amplifier (e.g., node 352 of sense amplifier 350A) a cell signal read from the corresponding memory cell. For example, in FIG. 3A if cell 361A is selected, the cell signal is delivered over bit line 371A to the positive bit line input/output node 352 of sense amplifier 350A. That signal is passed to the bi-directional data input/output node 351 for delivery to the output inverting circuit 388 over path 320. Also, the same cell signal is inverted (as an inverted cell signal) internally through the sense amplifier 350A and outputted at the bi-directional data bar input/output node (e.g., node 356) on the negative side of the sense amplifier (e.g., amplifier 350A) for delivery to the output inverting circuit 388 over path 330.

Whatever operation was performed on the input signals by the input inverting circuit 310 must again be performed on the output signals, delivered by the corresponding sense amplifier, by the output inverting circuit 388. As such, the memory address indicates which side of the memory array is being read, and will determine which actions are to be taken by the output inverting circuit 388. When the memory cell is located on the A-side of the memory array, at 575 the method includes inverting the data signal received from the bi-directional data input/output port of the sense amplifier to generate a data out signal, which is delivered to the data output port for purposes of reading. For illustration, looking to FIG. 3A, when reading from a memory cell located on the A-side sub-array 380A, a cell signal is delivered from the memory cell to the positive bit line input/output node and passed to the positive bi-directional data input/output node 351. The passed cell signal detected at the bi-directional data input/output node 351 of a corresponding sense amplifier (e.g., amplifier 350A) is then delivered over path 320 to output inverting circuit 388. Since the memory cell is located on the A-side sub-array 380A, the left path 381 is activated by transistor 382, such that the passed cell signal is inverted before being outputted as a data out signal 395. Further, the sense amplifier (e.g., amplifier 350A) outputs an inverted cell signal at the negative bi-directional data input/output node (e.g., node 356), for delivery over path 330 to the output inverting circuit 388.

Additionally, at 580 the method includes detecting the inverted cell signal (data signal) at the negative bi-directional data bar input/output node (e.g., node 356) on the right side of the sense amplifier, and inverting the inverted cell signal at an output inverting circuit to generate a data_bar out signal, which is delivered to the data_bar output node for purposes of reading. That is, when an address of a memory cell to be read is coupled to a bit line that is further coupled to a true side of a corresponding sense amplifier, a data_bar output value of a data signal received from the negative side of the corresponding sense amplifier is inverted to generate an inverted data_bar output value. For illustration, looking to FIGS. 3 and 4, an inverted cell signal detected at the bi-directional data_bar input/output node (e.g., node 356 of sense amplifier 350A) is then delivered over path 330 to output inverting circuit 388. The left path 386 is activated by transistor 387, such that the inverted cell signal is again inverted before being outputted as a data_bar out signal 397.

On the other hand, if the read operation is performed on a memory cell located on the right side of the open bit-line memory array, then the method proceeds to 585. That is, at 565 it is determined that the memory cell identified for reading is coupled to a bit line that is further coupled to a negative side of a corresponding sense amplifier. At 585, a READ operation is performed on a memory cell located on the B-side of the memory array (e.g., B-side sub-array 380B of FIG. 3A). That is, the method includes receiving at the negative node (e.g., negative bit line input/output node) of the sense amplifier a cell signal read from the corresponding memory cell. For example, in FIG. 3A if cell 363A is selected, the cell signal is delivered over bit line bar 371B to the negative bit line bar input/output node 357 of sense amplifier 350A. That cell signal is directly passed to the negative bi-directional data_bar input/output node 356 for delivery to the output inverting circuit 388 over path 330. Also, the same cell signal is internally inverted (as an inverted cell signal) through the sense amplifier 350A and outputted at a bi-directional data input/output node (e.g., node 351) on the positive side of the sense amplifier (e.g., amplifier 350A) for delivery to the output inverting circuit 388 over path 320.

Whatever operation was performed on the external data value of the input signal by the input inverting circuit 310 must again be performed on the cell signals, delivered by the corresponding sense amplifier, by the output inverting circuit 388. As such, the address of the memory cell indicates which side of the memory array is being read, and will determine which actions are to be taken by the output inverting circuit 388. Since at 565 it was determined that the memory cell is located on the B-side of the memory array, the method includes at 590 delivering the passed cell signal detected at the bi-directional data input/output node on the negative side of the sense amplifier as a data_bar out signal to the data_bar output port for purposes of reading. For illustration, looking to FIG. 3A, a passed cell signal detected at the negative bi-directional data_bar input/output node (e.g., node 356) is then delivered over path 330 to output inverting circuit 388. The right path 330 is activated by transistor 389, such that the cell signal is passed directly as a data_bar out signal 397.

Additionally, at 595 the method includes detecting the inverted cell signal at the bi-directional data input/output node on the positive side of the sense amplifier, and passing the inverted cell signal through the output inverting circuit to generate a data out signal, which is delivered to the data output node for purposes of reading. For illustration, looking to FIG. 3A, an inverted cell signal generated at the positive bi-directional data input/output node (e.g., node 351 of sense amplifier 350A) is then delivered over path 320 to output inverting circuit 388. The right path 320 is activated by transistor 384, such that the inverted cell signal is directly passed as a data out signal 395.

Figure 6:
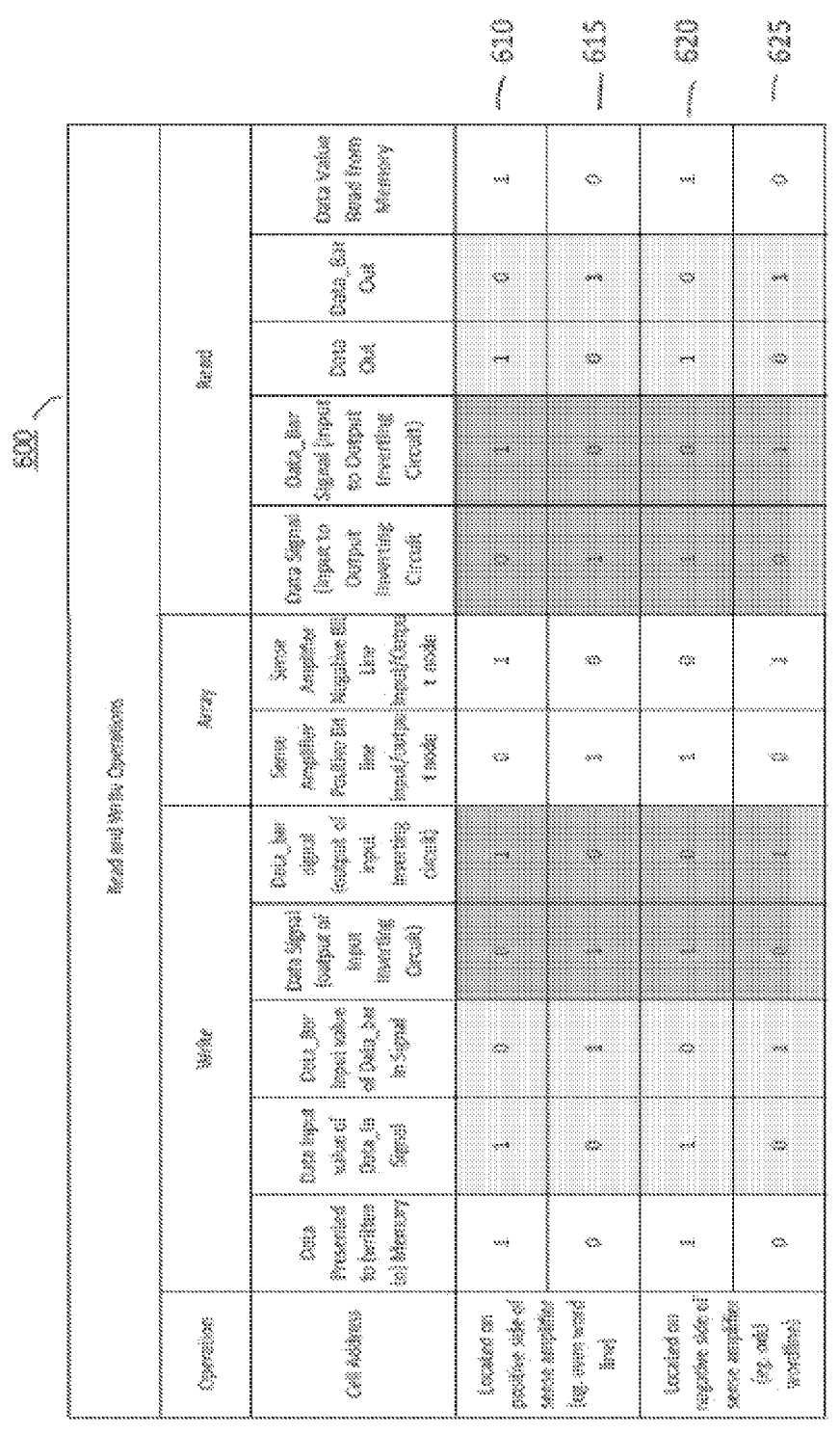

FIG. 6 is a table 600 illustrating the treatment of signals in one embodiment. Rows 610 and 615 illustrate respectively the reading and writing of an external data 1 value and external data 0 value to a memory cell coupled to the positive side of a sense amplifier (e.g., as in an even word line in a folded bit line array or as in a A-side sub-array 380A of FIG. 3A in an open bit line array). Rows 620 and 625 illustrate the reading and writing of an external 1 data value and external data 0 value respectively to a memory cell coupled to a negative side of a sense amplifier (e.g., as in an odd word line in a folded bit line array or as in a B-side sub-array 380B of FIG. 3A in an open bit line array).

In particular, an input signal having an external data value of "1" addressed to a memory cell coupled to the positive side of a sense amplifier is treated in row 610. That is, the external data value of "1" generates a data_in signal (having data input value of "1") and a complement data_bar in signal (having data_bar input value of "0"). Since the memory cell is coupled to the positive side of a sense amplifier, the input inverting circuit inverts the data input values for both the data_in signal and the data_bar_in signal. As such, the data input value of "1" of the data_in signal is inverted to generate a data signal "0", and the data_bar input value of "0" of the data_bar_in signal is inverted to generate a data_bar signal of "1". The data signal is delivered to the bi-directional data input/output node on the positive side of the sense amplifier as an electrical "0" and the data_bar signal is delivered to the bi-directional data_bar input/output node on the negative side of the sense amplifier as an electrical "1". The application of these signals to the data and data_bar input/output nodes of the sense amplifier drives the positive bit line input/output node of the sense amplifier to a "0" which is written to a corresponding memory cell and drives the negative bit line input/output node of the sense amplifier to a "1", though this "1" signal is not written to a memory cell.

An input signal having an external data value of "0" and addressed to a memory cell coupled to the positive side of a sense amplifier is treated in row 615. That is, the external data value of "0" generates a data_in signal (having data input value of "0") and a complement data_bar in signal (having data_bar input value of "1"). Since the memory cell is coupled to the positive side of a sense amplifier, the input inverting circuit inverts the data input values for both the data_in signal and the data_bar_in signal. As such, the data input value of "0" of the data_in signal is inverted to generate a data signal "1" and the data_bar input value of "1" of the data_bar_in signal is inverted to generate a data_bar signal of "0". The data signal is delivered to the bi-directional data input/output node on the positive side of the sense amplifier as an electrical "1" and the data_bar signal is delivered to the bi-directional data_bar input/output node on the negative side of the sense amplifier as an electrical "0". The application of these signals to the data and data_bar input/output nodes of the sense amplifier drives the positive bit line input/output node of the sense amplifier to a "1" which is written to a corresponding memory cell, and drives the negative bit line input/output node of the sense amplifier to a "0", though this "0" signal is not written to a memory cell.

In particular, an input signal having an external data value of "1" addressed to a memory cell coupled to the negative side of a sense amplifier is treated in row 620. That is, the external data value of "1" generates a data_in signal (having data input value of "1") and a complement data_bar in signal (having data_bar input value of "0"). Since the memory cell is coupled to the negative side of a sense amplifier, the input inverting circuit passes the data input values for both the data_in signal and the data_bar_in signal without inversion. As such, the data input value of "1" of the data in signal generates a data signal "1" and the data_bar input value of "0" of the data_bar_in signal generates a data_bar signal of "0". The data signal is delivered to the bi-directional data input/output node on the positive side of the sense amplifier as an electrical "1" and the data_bar signal is delivered to the bi-directional data_bar input/output node on the negative side of the sense amplifier as an electrical "0". The application of these signals to the data and data_bar input/output nodes of the sense amplifier drives the negative bit line input/output node of the sense amplifier to a "0" which is written to a corresponding memory cell and drives the positive bit line input/output node of the sense amplifier to a "1", though this "1" signal is not written to a memory cell.

Further, an input signal having an external data value of "0" addressed to a memory cell coupled to the negative side of a sense amplifier is treated in row 625. That is, the external data value of "0" generates a data_in signal (having data input value of "0") and a complement data_bar in signal (having data_bar input value of "1"). Since the memory cell is coupled to the negative side of a sense amplifier, the input inverting circuit passes the data input values for both the data_in signal and the data_bar_in signal without inversion. As such, the data input value of "0" of the data in signal generates a data signal "0" and the data_bar input value of "1" of the data_bar_in signal generates a data_bar signal of "1". The data signal is delivered to the bi-directional data input/output node on the positive side of the sense amplifier as an electrical "0" and the data_bar signal is delivered to the bi-directional data_bar input/output node on the negative side of the sense amplifier as an electrical "1". The application of these signals to the data and data_bar input/output nodes of the sense amplifier drives the negative bit line input/output node of the sense amplifier to a "1" which is written to memory cell and drives the positive bit line input/output node of the sense amplifier to a "0", though this "0" signal is not written to a memory cell.

FIGS. 7-8 in combination are circuit diagrams and flow diagrams illustrating a folded bit-line architecture memory array in a memory system that is configured to store selected data in memory cells of a memory array in a preferred bias condition, in embodiments of the present invention. Also, the systems and methods disclosed in FIGS. 7-8 are implemented within memory system 100A of FIG. 1A and by the flow diagrams 200A-B of FIGS. 2A-B, in embodiments of the present invention.

In particular, FIG. 7 is an exemplary layout of a folded bit line memory array 700 that is configured to store selected data in memory cells in a preferred bias condition, wherein input signals are delivered to the memory array 700 with an expected bias, in accordance with one embodiment of the invention. As an example, memory array 700 is implementable within memory system 100A of FIG. 1A.

Additionally, memory array 700 includes a plurality of memory cells, each of which is associated with a preferred bias condition, as previously described. For example, and for purposes of illustration, in the implementation of a DDR SDRAM memory cells in the memory array 700, a preferred bias condition is the default state, or an electrical "0", which provides greater immunity to data loss due to noise, soft error rates, leakage, and other non-defect factors that could impact data integrity. It should be noted that the embodiments described in this patent also apply to different configurations, for example where a sense amplifier is shared with a plurality of arrays using isolation devices serving multiplexing functions.

As shown in FIG. 7, a data in/out signal 701 is delivered to an input/output inverting circuit 750. Also, a data_bar in/out signal 703 is delivered to the input/output inverting circuit 750. In one embodiment, the input/output inverting circuit 750 either inverts or passes the data in/out signal 701 and data_bar in/out signal 703 through the appropriate circuit path depending on whether the address points to a cell that is coupled to the bit line or the bit line bar, as will be further described in relation to FIG. 8. In another embodiment, the input/output inverting circuit 750 either inverts or passes the data in/out signal 701 and/or data_bar in/out signal 703 through the appropriate circuit path depending on which word line (for example, even or odd) that is activated for a given memory cell to which the original input signal is assigned for storage, as described in relation to FIGS. 6 and 8. The input/output inverting circuit 750 receives a control signal via node 753 that is delivered from an address decoder that instructs the input/output inverting circuit 750 whether or not to invert a received signal intended for storing, or as an output.

Signals from the input/output inverting circuit 750 are delivered to a plurality of sense amplifiers that are coupled to memory cells through word line transistors that are enabled by word line drivers (not shown) in the memory array 700 for selection of a particular memory cell for purposes of performing WRITE and READ operations. In the folded bit line memory array 700, each word line is coupled to a memory transistor on every other bit line. As such, each sense amplifier reads data presented on bit lines or bit bar lines from the same memory array 700. Sense amplifiers may be configured in memory array 700 in varying manners, in various embodiments. For instance, sense amplifier 710 operates in the same manner as one of the plurality of sense amplifiers 350 of FIG. 3A.

For simplicity and purposes of illustration, only one sense amplifier 710 is shown that is coupled to bit line 720A and bit line bar 720B. The positive bit line input/output node 713 of the sense amplifier 710 is coupled to bit line 720A and the negative node 714 is coupled to the bit line bar 720B. For instance, the positive bit line input/output node 713 delivers data values generated from the data in signal and data_bar in signal to the bit line 720A after manipulation by the input/output inverting circuit 750. Bit line 720A is coupled to transistors 731 and 732, a pair that share a bit line contact. Also, the negative bit line bar input/output node 714 delivers data values generated from the data in signal and data_bar in signal after manipulation by the input/output inverting circuit 750. Bit line bar 720B is coupled to memory cells 736 and 737 that also share a bit line contact. Additional transistors may be coupled to bit line 720A and bit line bar 720B.

Addressing circuitry (not shown) controls column decoders to select a sense amplifier 710 and address a corresponding pair of bit lines. More particularly, row decoders and column decoders (including sense amplifiers) are used to selectably access memory cells in either of the bit line or bit line bar in response to address signals provided by an external controller (e.g., memory controller). For instance, column select node 790 receives an input indicating whether the sense amplifier 710 should communicate with the data in/out and data_bar in/out signals that are coupled to nodes 717 and 718.

Each of the rows includes a corresponding word line, wherein word lines are used to select a particular row of memory cells in memory array 700 by activating FETs in that particular row for purposes of writing, reading, and erasing. For instance, word line WL0 is used to access multiple memory cells (including cell 731), WL1 is used to access multiple memory cells (including cell 736), WL2 is used to access multiple memory cells (including cell 732), and WL3 is used to access multiple memory cells (including cell 737). Word lines are paired in association with one of a pair of bit lines (e.g., bit line 720A or bit line bar 720B). For instance, word lines including WL0 and WL2, as even word lines, are associated respectively with memory cells, including cell 731 (coupled to WL0) and cell 732 (coupled to WL2), such that each memory cell is accessed via bit line 720A. Also, word lines including WL1 and WL3, as odd word lines, are associated with memory cells, including cell 736 (coupled to WL1) and cell 737 (coupled to WL3), such that each memory cell is accessed via bit line bar 720B.

The input/output inverting circuit 750 also manipulates data read from the memory cells appropriately, depending on whether the associated memory cell is accessed using a bit line or a bit line bar. Correspondingly, data read from a memory cell is manipulated depending on which word line (e.g., even or odd) is used to access the corresponding memory cell. That is, the signal read from a memory cell will be manipulated in the same manner (e.g., inverted or passed) in the same manner that the input signal was manipulated.

Figure 8A:
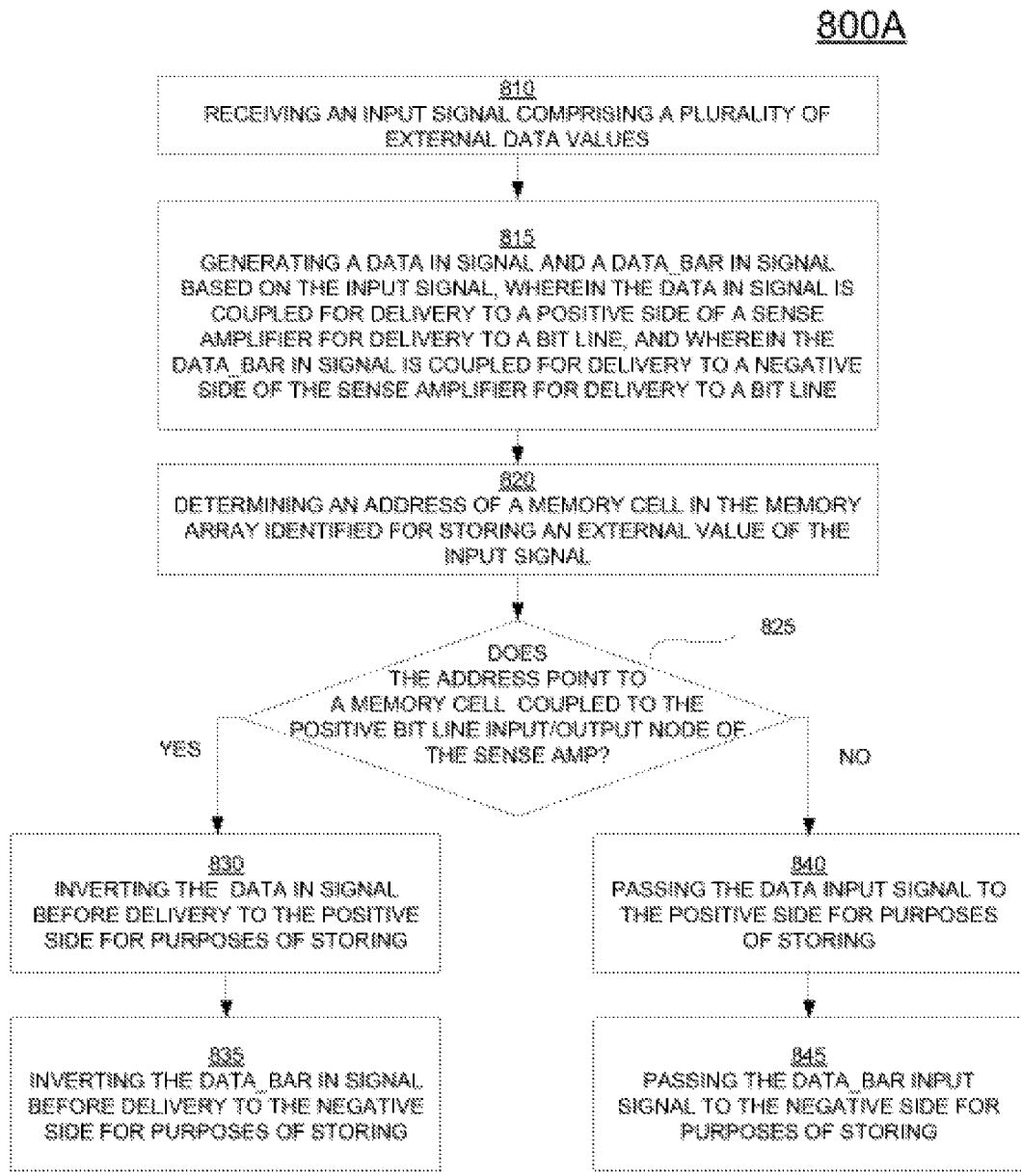
FIG. 8A is a flow chart illustrating a method of storing data into a folded bit-line memory array, wherein data is stored in memory cells in a preferred bias condition, in accordance with one embodiment of the invention.

FIG. 8A is a flow chart 800A illustrating a method of storing data into a folded bit line memory array, wherein selected data is stored in memory cells in a preferred bias condition, in accordance with one embodiment of the invention. For instance, flow chart 800A is implemented within memory system 100A of FIG. 1A and memory arrays 300A-C of FIGS. 3A-C, where appropriate, in embodiments.

At 810, the method includes receiving an input signal comprising one or more external data values, wherein the data values may comprise one or more data states (e.g., electrical "0", "1", etc.). For example, the input signal is delivered from a memory controller for purposes of storing into a memory cell of an array. At 815, the method includes generating a data in signal and a data_bar in signal based on the input signal. In one implementation, a differential signal generator (e.g., generator 110) is configured to generate the data in signal and a data_bar in signal. As previously described, the data_bar in signal comprises a complement of the data in signal. Moreover, the data in signal is coupled for delivery to a positive side of a sense amplifier, and the data_bar in signal is coupled for delivery to a negative side of the sense amplifier. In one embodiment, the data in signal and the data_bar in signal are coupled to the sense amplifier through an input inverting circuit.

At 820, the method includes determining an address of a memory cell in the memory array that is identified for storing the input signal. For instance, external address circuitry (e.g., located in a memory controller) determines the location of the identified memory cell and outputs address signals controlling, in part, row decoders, column decoders, and sense amplifiers for accessing the identified memory cell.

At 825, the method includes determining whether the address points to a memory cell that is coupled to a bit line that is further coupled to a positive node of the corresponding sense amplifier. For instance, if it is determined that the address points to a memory cell coupled to an even word line and the corresponding bit line is coupled to the positive side bit line input/output node of the sense amplifier, the process proceeds to block 830.

At 830, the method includes inverting the data input value of the data in signal before delivery to the positive bi-directional data input/output node of the sense array for purposes of storing. Further, at 835 the method includes inverting the data_bar input value of the data_bar in signal before delivery to the negative bi-directional data input/output node of the sense amplifier for purposes of storing to a memory cell accessed by an even word line. For illustration, looking to FIG. 7 the input/output inverting circuit 750 inverts a data in/out signal 701 before delivery to the positive bi-directional data input/output node 717. The inverted data in signal is outputted at positive bit line input/output node 713 for purposes of storing to a memory cell accessed by an even word line. Also, the input/output inverting circuit 750 inverts a data_bar in/out signal 703 before delivery to the negative bi-directional data_bar input/output node 718. The inverted data_bar in signal is internally inverted within the sense amplifier 710, and then outputted at the positive bit line input/output node 713 for purposes of storing to a memory cell accessed through an even word line.

On the other hand, when the address points to a memory cell that is coupled to a bit line bar line which is further coupled to the negative side of a sense amplifier, the process proceeds to block 840. In other words, when the address indicates that the memory cell is accessed using an odd word line and corresponding bit line bar, the process proceeds to block 840.

In particular, at 840 the method includes passing the data in signal through the input inverting circuit and delivering the passed data in signal to the positive bi-directional data input/output node of the corresponding sense amplifier. The passed data in signal is internally inverted within the sense amplifier before being outputted at the negative bit line bar input/output node for purposes of storing to a memory cell accessed by a corresponding odd word line. Further, at 845, the method includes passing the data_bar in signal through the input inverting circuit and delivering the passed data_bar in signal to the negative bit line bar input/output node for purposes of storing to a memory cell accessed by a corresponding odd word line. For illustration, looking to FIG. 7, the input/output inverting circuit 750 passes the data in/out signal 701 to the positive bi-directional data input/output node 717, and passes the data_bar in/out signal 703 to the negative bi-directional data bar input/output node 718, for purposes of storing to a memory cell accessed by an odd word line.

Figure 8B:
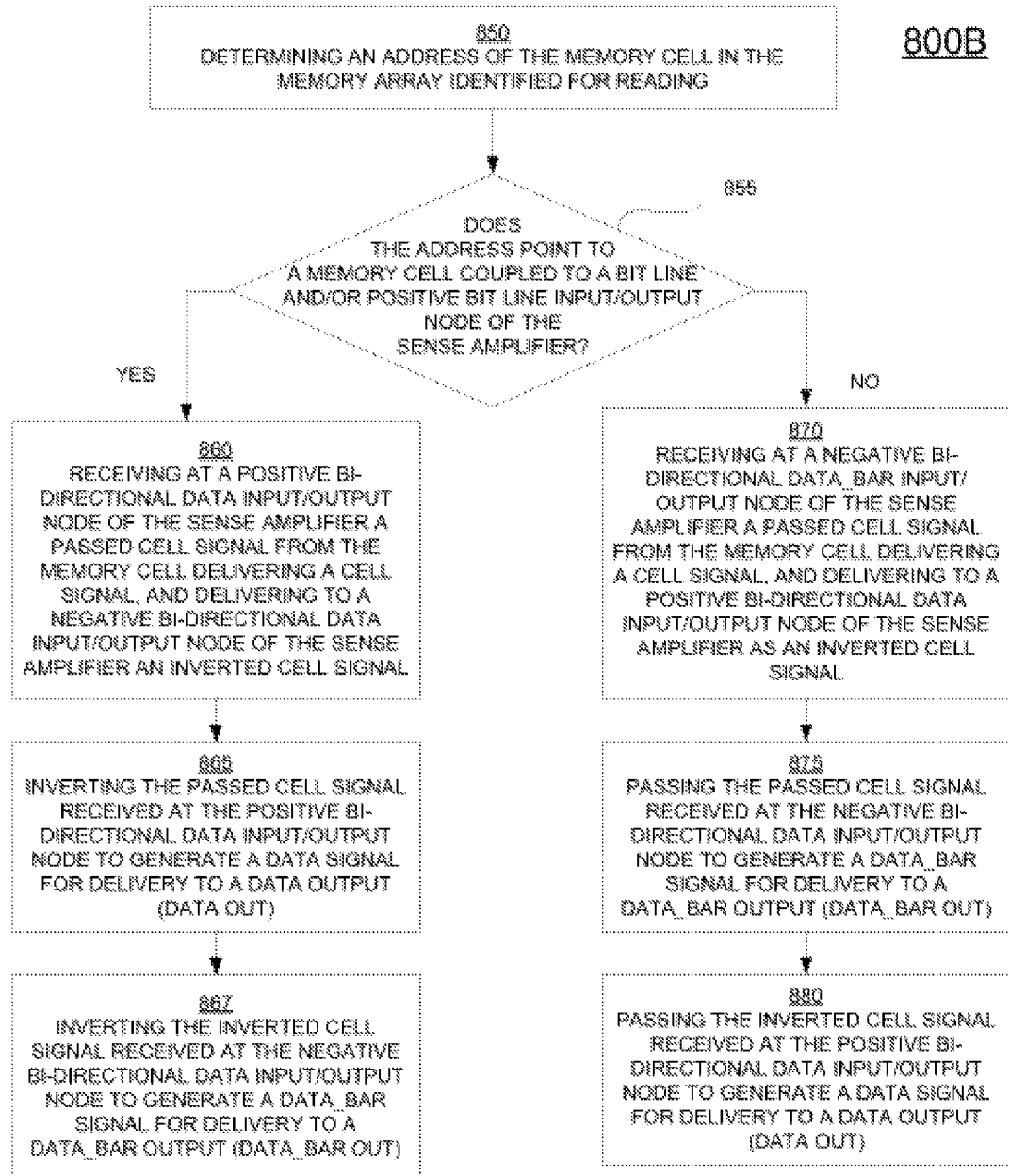
FIG. 8B is a flow chart illustrating a method of reading data from a folded bit-line memory array, wherein selected data is stored in memory cells of the memory array in a preferred bias condition, in accordance with one embodiment of the invention.

FIG. 8B is a flow chart 800B illustrating a method of reading data from a folded bit-line memory array, wherein selected data is stored in memory cells of the memory array in a preferred bias condition, in accordance with one embodiment of the invention. For instance, flow chart 800B is implemented within memory system 100A of FIG. 1A and memory arrays 300A-C of FIGS. 3A-C, where appropriate, in embodiments.

In particular, at 850, an address of a memory cell in the memory array is identified for reading. That is, it is determined whether the memory cell identified for reading is coupled to a bit line or to a bit line bar. For instance, external address circuitry (e.g., located in a memory controller) determines the location of the identified memory cell, and outputs address signals controlling, in part, row decoders, column decoders, and sense amplifiers for accessing the identified memory cell.

At 855, the method includes determining whether the address points to a memory cell of a sub-array coupled to a bit line that is further coupled to a positive bit line input/output node of the sense amplifier. In other words, the method determines whether the memory cell is coupled to an even or odd word line. If the memory cell is coupled to the positive bit line input/output node of the sense amplifier, the method proceeds to 860, otherwise if the memory cell is not coupled to the positive input/output node, the method proceeds to 870.

Also, at 860, a READ operation is performed on a memory cell that is coupled to a bit line. More particularly, the memory cell (e.g., memory cell 731) is accessed through an even word line (e.g., WL0) and corresponding bit line (e.g., bit line 720A). That is, the method includes detecting at the positive bi-directional bit line input/output node 713 of the sense amplifier a signal read from the corresponding memory cell that is accessed through an even word line and corresponding bit line. For example, in FIG. 7 if cell 731 is selected, a cell signal is delivered over bit line 720A from cell 731 to the positive bit line input/output node 713 of sense amplifier 710. That cell signal is passed to the positive bi-directional data input/output node 717 for delivery to the input/output inverting circuit 750. Also, the same cell signal is inverted in the sense amplifier 710 and outputted at negative bi-directional data_bar input/output node 718 for delivery to the input/output inverting circuit 750.

Whatever operation was originally performed on the input signals by the input/output inverting circuit 750 must again be performed on the output signals, as delivered by the corresponding sense amplifier by the input/output inverting circuit 750. As such, when the memory cell is accessed through an even word line and corresponding bit line, at 865 the method includes inverting the cell signal detected at the positive bi-directional data input/output node of the sense amplifier to generate a data out signal, which is delivered to the data output port for purposes of reading. For illustration, looking to FIG. 7, a cell signal detected at the positive bit line input/output node 713 and passed on to positive bi-directional data input/output node 717 in the sense amplifier 710, is then delivered to input/output inverting circuit 750. The passed cell signal is inverted in the input/output inverting circuit 750 before being outputted as a data in/out signal 701.

Additionally, at 867 the method includes generating an inverted cell signal at the negative bi-directional data_bar input/output node of the sense amplifier. The inverted cell signal is inverted through the input/output inverting circuit to generate a data_bar out signal, which is delivered to the data_bar output port for purposes of reading. For illustration, looking to FIG. 7, a cell signal detected at the positive bit line input/output node 713 is outputted as an inverted cell signal at the negative bi-directional data_bar input/output node 718, and the inverted cell signal is delivered to input/output inverting circuit 750. The inverted cell signal is again inverted in the input/output inverting circuit 750 before being outputted as a data_bar out signal.

On the other hand, if the READ operation is performed on a memory cell accessed through an odd word line and corresponding bit line bar (of a corresponding bit line pair) in the folded bit line memory array, then the method proceeds to 870. That is, at 850, it is determined that the memory cell identified for reading is coupled to a bit line bar that is further coupled to a negative side of a corresponding sense amplifier. At 870, a READ operation is performed on a memory cell (e.g., memory cell 736) accessed through a bit line bar (e.g., 720B) and a corresponding odd word line (e.g., WL1). That is, the method includes detecting at the negative bit line bar input/output node (e.g., node 714) of the sense amplifier a signal read from the corresponding memory cell. For example, in FIG. 7 if cell 736 is selected, the signal is delivered over bit line bar 720B to the negative bit line bar input/output node 714 of sense amplifier 710. That cell signal is passed to the negative bi-directional data_bar input/output node 718 for delivery to the input/output inverting circuit 750. Also, the same cell signal is inverted in the sense amplifier 710 and outputted at the positive bi-directional data input/output node 717 for delivery to the input/output inverting circuit 750.

Whatever operation was performed on the external data values of the input signal by the input/output inverting circuit 750 when storing to a memory cell must again be performed on the output signals, delivered by the corresponding sense amplifier, by the input/output inverting circuit 750. As such, when the memory cell is accessed through a bit line bar and corresponding odd word line, at 875 the method includes passing the passed cell signal, detected at the negative bi-directional data input/output node of the sense amplifier, through the inverting circuit to generate a data_bar out signal, which is delivered to the data_bar output port for purposes of reading. For illustration, looking to FIG. 7, a cell signal detected at the negative bit line bar input/output node 714 is outputted as a passed cell signal at the negative bi-directional data_bar input/output node 718, and the passed cell signal is delivered to and passed through the input/output inverting circuit 750 before being outputted as a data_bar out signal.

Additionally, the method includes generating an inverted cell signal at the positive bi-directional data input/output node of the sense amplifier, and passing the inverted cell signal through the input/output inverting circuit to generate a data out signal, which is delivered to the data output port for purposes of reading. For illustration, looking to FIG. 7, a cell signal detected at the negative bit line bar input/output node 714 is outputted as an inverted cell signal detected at positive bi-directional data input/output node 717, and the inverted cell signal is delivered to and passed through the input/output inverting circuit 750 before being outputted as a data out signal.

Thus, according to embodiments of the present invention, bit cell topographies are disclosed that are configured to optimize data retention and soft error rate immunity based on an expectation that more cells are presented for storing to a memory cell (e.g., DRAM) as a first state, but are stored into the memory array in a second state.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented using the inventive principles described herein. For example, for clarity most switches and pass gates have been illustrated with N-channel devices. With the appropriate logic control, P-channel devices could be used instead or in addition.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed:

1. A method of providing a dynamic random access memory (DRAM) integrated circuit, comprising:
    providing an external signal interface, comprising:
        a plurality of interface circuits, wherein:
            each interface circuit is adapted to be coupled to an external signal line for the input and output of binary external data, wherein a first voltage range on the external signal line corresponds to a first binary logic state and a second voltage range on the external signal line corresponds to a second binary logic state, and
            the logic polarity of the external data is statistically distributed to favor the first binary logic state;
    providing a memory array, comprising:
        a plurality of memory cells, wherein:
            each memory cell comprises a data storage capacitor, wherein charging the capacitor to a third voltage range corresponds to a third binary logic state and charging the capacitor to a fourth voltage range corresponds to a fourth binary logic state,
            a leakage current in each memory cell is substantially larger when its capacitor charged to the third voltage range, and
            the leakage current in each memory cell is substantially smaller when its capacitor charged to the fourth voltage range; and
    providing a plurality of selective inversion circuits coupled between the plurality of interface circuits and the memory array and adapted to minimize the leakage current of the memory array, wherein:
        external data is stored in the array such that data in the first binary logic state is stored in each memory cell as the fourth binary logic state and the second binary logic state is stored in a memory cell as the third binary logic state.

2. The method of providing a DRAM integrated circuit of claim 1, further comprising:
    providing a plurality of sense amplifier circuits coupled between the plurality of selective inversion circuits and the memory array; and
    providing a plurality of output selective inversion circuits coupled to the plurality of sense amplifier circuits, wherein:
        the selective inversion circuits provide external data in differential format to the sense amplifier circuits during a write memory access, and
        the sense amplifier circuits provide stored data in differential format to the output selective inversion circuits during a read memory access.

3. The method of providing a DRAM integrated circuit of claim 2, further comprising:
    providing an address path coupled to the memory array, the plurality of selective inversion circuits, and the plurality of output selective inversion circuits, wherein:
        the address path selects a portion of the plurality of memory cells for a memory access,
        the selective inversion of the external data is determined by the address path, and
        the selective inversion is the same for both read memory accesses and write memory accesses to the same selected portion of the plurality of memory cells.

4. The method of providing a DRAM integrated circuit of claim 3, wherein:
    the first and second binary states correspond to a single high-low pair representing a binary bit on an external signal line; and
    the third and fourth binary states correspond to a single high-low pair representing a single binary bit stored in a memory cell.

5. The method of providing a DRAM integrated circuit of claim 4, wherein:
    the first binary logic state corresponds to a logic high state and the second binary state corresponds to a logic low state.

6. The method of providing a DRAM integrated circuit of claim 4, wherein:
    the third binary logic state corresponds to a logic high state and the fourth binary state corresponds to a logic low state.

7. A method of providing a dynamic random access memory (DRAM) integrated circuit, comprising:
    providing an external signal interface, comprising:
        a plurality of interface circuits, wherein:
            each interface circuit is adapted to be coupled to an external signal for the input and output of external binary data, wherein a first voltage range corresponds to a first binary logic state and a second voltage range corresponds to a second binary logic state, and the logic polarity of the external binary data is distributed to favor statistically the first binary logic state;
providing a memory array, comprising:
  a plurality of memory cells organized into rows and columns, wherein:
    each memory cell comprises a data storage capacitor, wherein charging the capacitor to a third voltage range corresponds to a third binary logic state and charging the capacitor to a fourth voltage range corresponds to a fourth binary logic state,
    a leakage current in each memory cell is substantially larger when its capacitor charged to the third voltage range, and
    the leakage current in each memory cell is substantially smaller when its capacitor charged to the fourth voltage range,
  a plurality of positive and negative bit line pairs each associated with one column, wherein:
    each memory cell is coupled to only one bit line,
    an equal number of memory cells are coupled to each bit line, and
    the positive and negative bit lines in a bit line pair are adapted to transmit data to and from the memory cells differentially in positive and negative binary logic polarity respectively, and
  a plurality of positive and negative word lines running parallel to the rows of memory cells, wherein:
    each memory cell is coupled to only one word line,
    positive word lines are coupled to memory cells which are coupled to positive bit lines, and
    negative word lines are coupled to memory cells which are coupled to negative bit lines;
providing a plurality of sense amplifiers coupled between the plurality of interface circuits and the array of memory cells, wherein:
  each sense amplifier is associated with one column, and
  each sense amplifier comprises a positive node coupled to the associated positive bit line and a negative node coupled to the associated negative bit line; and
providing a control circuit, comprising:
  an address decoder circuit coupled to the plurality of word lines, and
  a plurality of selective inversion circuits coupled to the address decoder and further coupled between the plurality of interface circuits and the plurality of sense amplifiers and adapted to minimize the leakage current of the memory array, wherein:
    the address decoder selects a word line for a write memory access,
    if the selected word line is a positive word line, then the external binary data is inverted by the selective inversion circuits and stored in the array such that the first binary logic state is stored in each accessed memory cell as the fourth binary logic state and the second binary logic state is stored in each accessed memory cell as the third binary logic state, and
    if the selected word line is a negative word line, then the external binary data is not inverted by the selective inversion circuits and stored in the array such that the first binary logic state is stored in each accessed memory cell as the fourth binary logic state and the second binary logic state is stored in each accessed memory cell as the third binary logic state.

8. The method of providing a DRAM integrated circuit of claim 7, wherein:
  the first and second binary states correspond to a single high-low pair representing a binary bit on an external signal line; and
  the third and fourth binary states correspond to a single high-low pair representing a single binary bit stored in a memory cell.

9. The method of providing a DRAM integrated circuit of claim 8, wherein:
  the first binary logic state corresponds to a logic high state and the second binary state corresponds to a logic low state.

10. The method of providing a DRAM integrated circuit of claim 8, wherein:
  the third binary logic state corresponds to a logic high state and the fourth binary state corresponds to a logic low state.

* * * * *